United States Patent
Hayakawa

(10) Patent No.: US 6,700,912 B2
(45) Date of Patent: Mar. 2, 2004

(54) HIGH-OUTPUT SEMICONDUCTOR LASER ELEMENT, HIGH-OUTPUT SEMICONDUCTOR LASER APPARATUS AND METHOD OF MANUFACTURING THE SAME

(75) Inventor: Toshiro Hayakawa, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 220 days.

(21) Appl. No.: 09/793,138

(22) Filed: Feb. 27, 2001

(65) Prior Publication Data
US 2001/0017870 A1 Aug. 30, 2001

(30) Foreign Application Priority Data

Feb. 28, 2000 (JP) .................... 2000-050767
Mar. 8, 2000 (JP) .................... 2000-063601
Mar. 9, 2000 (JP) .................... 2000-064657

(51) Int. Cl.$^7$ ................................ H01S 5/00
(52) U.S. Cl. ................................ 372/43
(58) Field of Search .................... 372/43, 50

(56) References Cited

U.S. PATENT DOCUMENTS 5,212,706 A * 5/1993 Jain .................... 372/50
5,936,266 A * 8/1999 Holonyak et al. .......... 257/106
6,487,230 B1 * 11/2002 Boucart et al. ........... 372/96
6,487,231 B1 * 11/2002 Boucart et al. ........... 372/96

OTHER PUBLICATIONS

"Reliability Improvement of 980–nm Laser Diodes with a new Facet Passivation Process", Hideyoshi Horie, IEEE Journal of Selected Topics in Quantum Electronics, vol. 5, No. 3, May/Jun. 1999.
Electronics Letters 7$^{th}$ May 1987, vol. 23, No. 10.
Electronics Letters 22$^{nd}$ Jan. 1998, vol. 34, No. 2.
Applied Physicsd Letters, vol. 41, p. 499, 1982.
Applied Physicsd Letters, vol. 42, p. 850, 1983.
Applied Physicsd Letters, vol. 75, p. 1839, 1999.
Abstract 04–157777, May 29, 1992.

* cited by examiner

Primary Examiner—Paul Ip
Assistant Examiner—Jeffrey N Zahn
(74) Attorney, Agent, or Firm—Sughrue Mion, PLLC

(57) ABSTRACT

A high-output semiconductor laser element includes a plurality of laser structures which are superposed on a substrate one on another with a P$^+$N$^+$-tunnel junction intervening between each pair of the laser structures. Each of the laser structures includes at least one active layer interposed between a P-type clad layer and a N-type clad layer. The active region of each of the laser structures is not smaller than 10 μm and not larger than 80 μm in width. The distance h between the active layers which are most distant from each other in the active layers of the laser structures is not larger than the width W of the active region which is the widest in the laser structures. The width of said semiconductor laser element is not smaller than W+2h.

12 Claims, 24 Drawing Sheets

F I G . 6
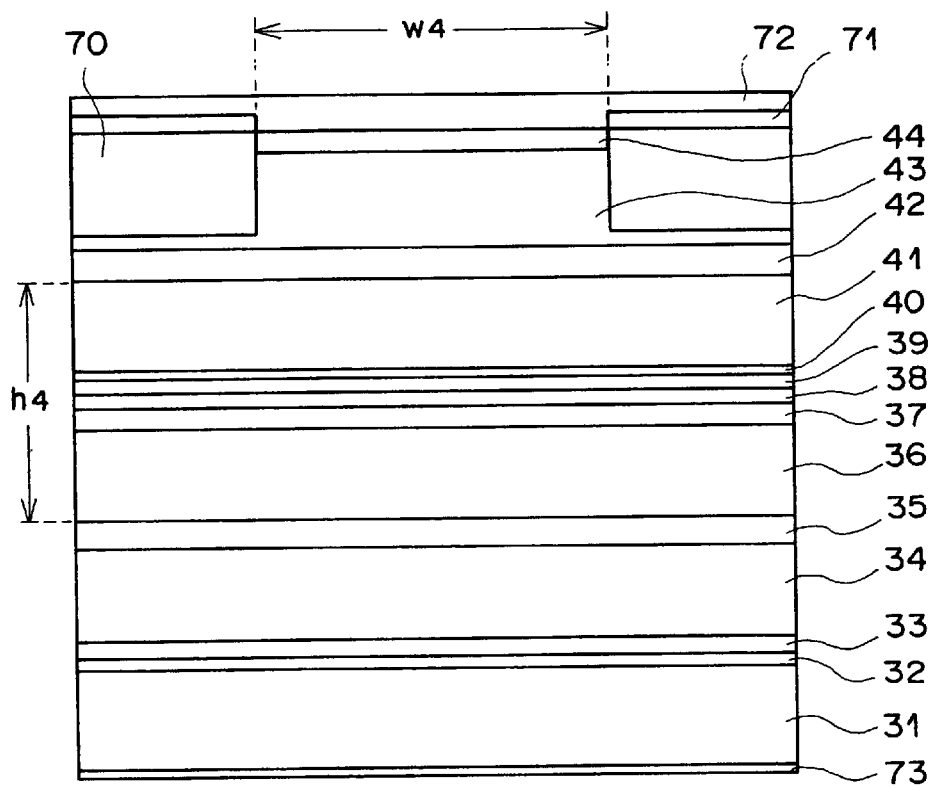

F I G. 7
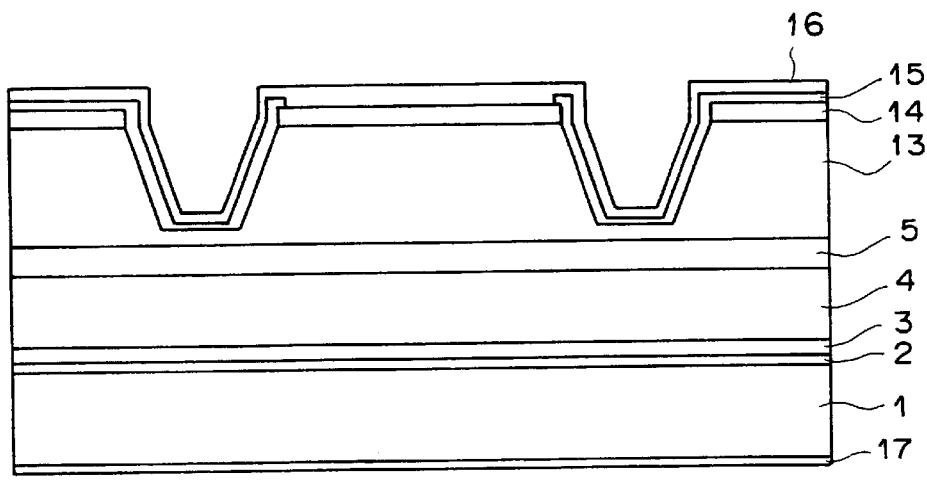
PRIOR ART

F I G. 13
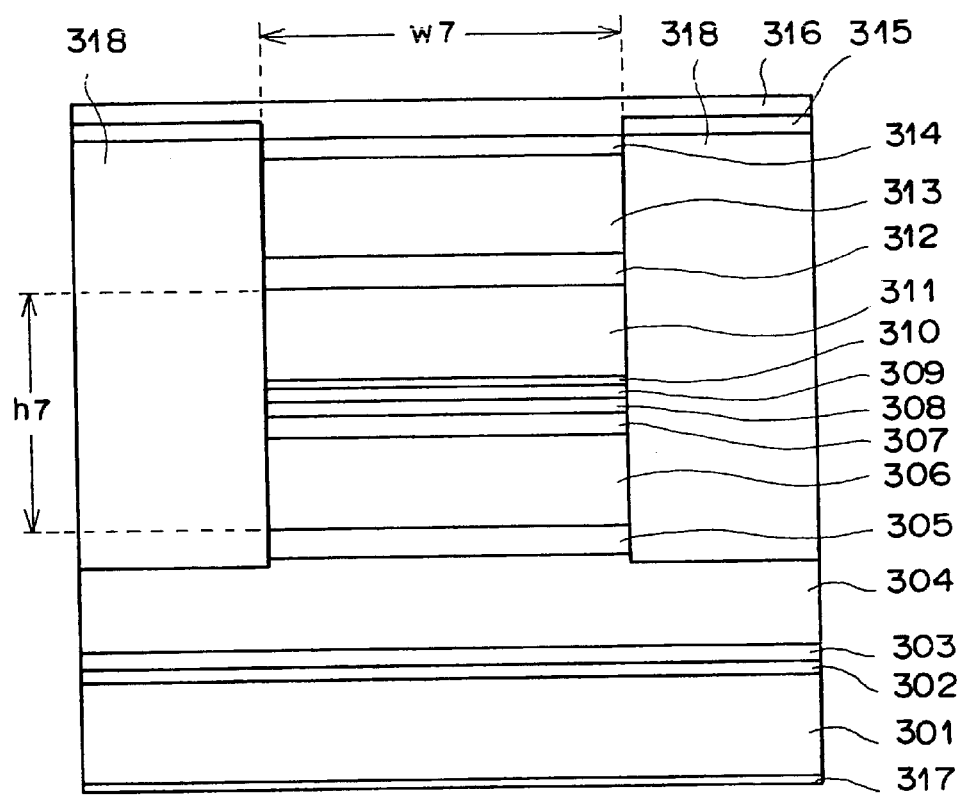

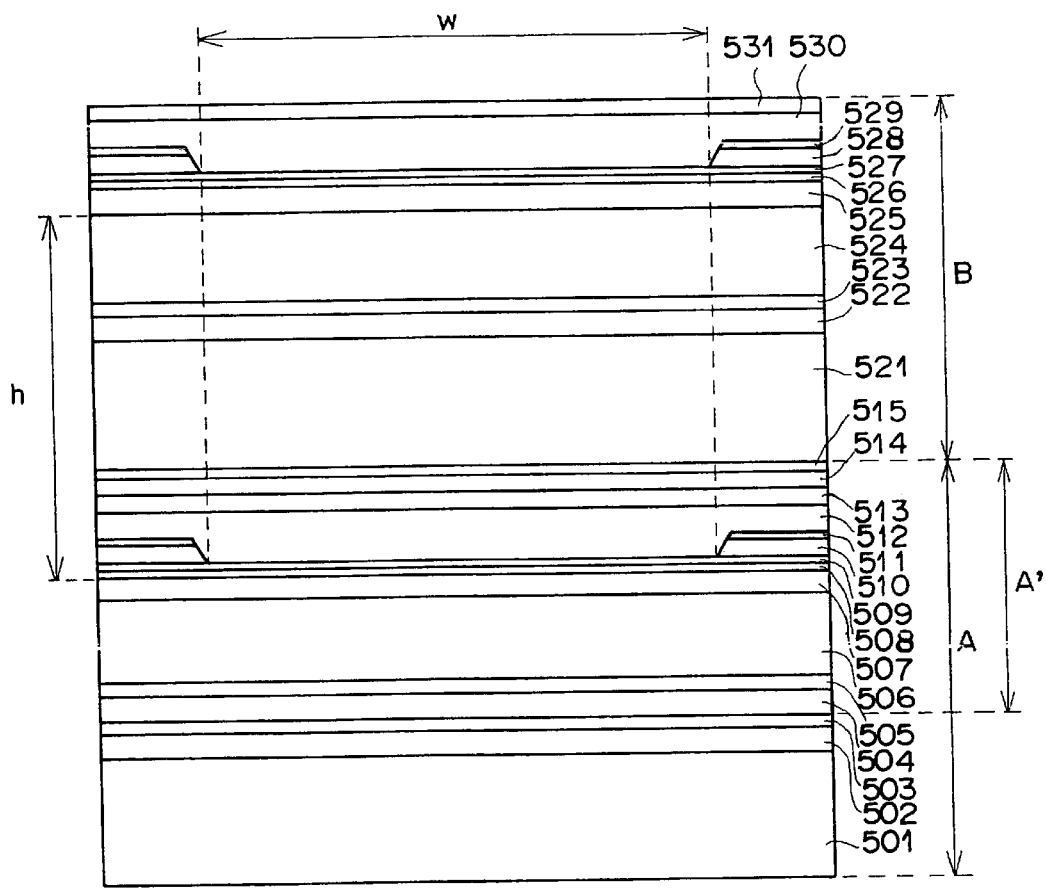
F I G . 19

F I G . 24
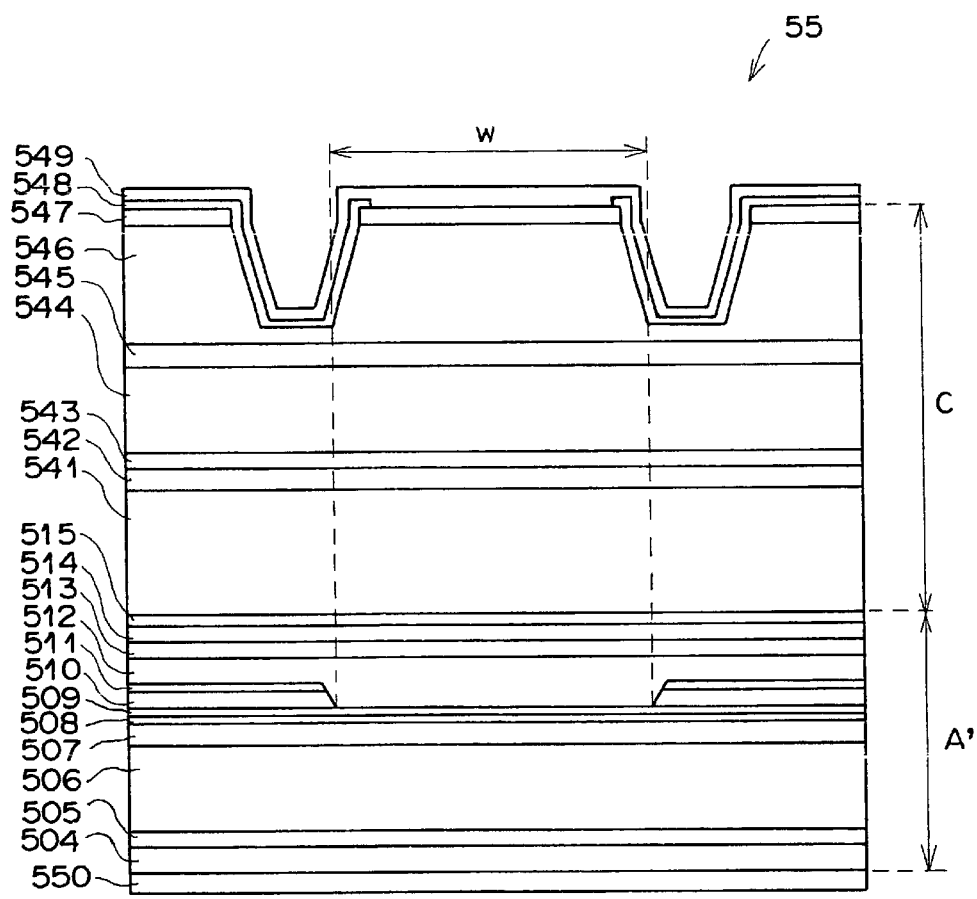

HIGH-OUTPUT SEMICONDUCTOR LASER ELEMENT, HIGH-OUTPUT SEMICONDUCTOR LASER APPARATUS AND METHOD OF MANUFACTURING THE SAME

BACKGROUND OF THE INVENTION

1. Field of the Invention

This invention relates to a semiconductor laser element, a semiconductor laser apparatus and a method of manufacturing the apparatus, and more particularly to a multiple transverse mode high-output semiconductor laser element which is large in width of the active region or width of the light emitting portion, an apparatus using the laser element and a method of manufacturing the apparatus.

2. Description of the Related Art

Nowadays semiconductor lasers have been put into practice in various fields. Especially, wide-stripe semiconductor lasers having an oscillation wavelength in the 0.7 to 1.6 $\mu$m band has come to be in wide use with increase in output power as a pumping light source for a solid sate laser, a fiber amplifier, a fiber laser and the like, as a primary light source for second harmonic generation, as a light source for forming an image by a laser-thermal system on a thermal recording medium, for instance, in printing, as a medical light source, and a light source for laser material processing and a soldering. For these applications, that the semiconductor laser is of a high output power is very important.

A multiple transverse mode high-output semiconductor laser which is not smaller than about 10 $\mu$m in width of the light emitting portion and is not shorter than several thousands of hours in guaranteed life has been put into practice. For example, such a high-output semiconductor laser can operate continuously at an output of 1.5 W with a width of light emitting portion of about 50 $\mu$m. For example, a semiconductor laser which comprises an InGaAsP quantum-well, an InGaP optical waveguide layer and an AlGaAs clad layer and is 50 $\mu$m in stripe width and 810 nm in oscillation wavelength has been empirically proved to be sufficiently practicable at 1.5 W. In this case, high reliability at high output power is realized by virtue of a high peak light density and a light exit face temperature lowering effect obtained by increase in thickness of layers which can be realized by use of an aluminum-free active layer and an optical waveguide layer whose electric resistance is reduced by doping.

As techniques of obtaining high reliability at high output power, there have been known, for instance, a technique in which the light exit end face is specially processed or is applied with a protective layer (IEEE J. Selected Topics in Quantum Electronics, vol. 5, p. 832 (1999)) and a technique in which the absorbance index near the light exit end face is reduced (D. F. Welch, W. Streifer, R. L. Thornton, and T. Paoli: Electron. Lett. vol. 23, p. 525 (1987)).

As for a multiple transverse mode high-output semiconductor laser which is not smaller than about 50 $\mu$m in stripe width, among those which make laser oscillation at 0.87 $\mu$m, there have been reported a laser which is 100 $\mu$m in stripe width and the catastrophic optical damage of which is 11.3 W, and a laser which is 200 $\mu$m in stripe width and the catastrophic optical damage of which is 16.5 W (Electronics Letters, vol. 34, No. 2, p. 184 (1998)).

Each of the semiconductor lasers has a light emitting region (active region) which is substantially of a single layer and the light distribution in the direction normal to the active layer is confined in a micro space in the semiconductor which is as small as a half of the wavelength. Accordingly, the light density is high and since heat is generated in a narrow region, temperature elevation at the light exit end face is large, which limits increase in output power.

Methods in which a plurality of active regions are provided in a direction normal to the respective growth layers of a semiconductor laser have been proposed. In "Appl. Phys. Lett. vol. 41, p. 499 (1982)", there is disclosed a method in which, in a full-face electrode type laser of a width of 100 $\mu$m, three double heterostructures (DH) are superposed one on another with a $P^+N^+$-tunnel junction intervening therebetween. In this structure, the active layers are spaced from each other by at least 2 $\mu$m, and the space between the active layers is larger than the wavelength, whereby the light density distribution is enlarged. However, when the growth layer side is fused to a heat sink for continuous oscillation, heat dissipation is feasible only in one direction and accordingly heat dissipation from the three active layers each forming a heat generating region is limited, which results in larger temperature elevation in active layers remote from the heat sink and in deterioration in reliability.

In the method disclosed in "Appl. Phys. Lett. vol. 42, p. 850 (1983)", output power of a laser is increased by providing a plurality of active layers in an optical waveguide region which is thickened to at least 2 $\mu$m. In this case, though peak light intensity can be lowered, the structure merely results in a pulse-driven full-face electrode laser of a width of 250 $\mu$m and hardly contributes to suppressing temperature elevation at the light exit end face during continuous oscillation or heat dissipation. Further, in Japanese Unexamined Patent Publication No. 4(1992)-157777, there is disclosed a semiconductor laser which is arranged to pump a solid state laser at a higher output power by superposing a pair of wide stripe chips, with an electrode intervening therebetween, provided with a stripe-like light radiating portion at the center thereof. However, this arrangement is disadvantageous in that since a pair of PN-junctions are superposed to form a PNPN-junction, it is difficult to uniformly excite the two laser chips in a controlled manner.

SUMMARY OF THE INVENTION

In view of the foregoing observations and description, the primary object of the present invention is to provide a high-output semiconductor laser element which is highly reliable and higher in maximum optical power.

Another object of the present invention is to provide a high-output semiconductor laser apparatus which is highly reliable and is increased in maximum optical output.

Still another object of the present invention is to provide a method of easily manufacturing such a high-output semiconductor laser apparatus.

In accordance with a first aspect of the present invention, there is provided a high-output semiconductor laser element comprising a plurality of laser structures, each comprising at least one active layer interposed between a P-type clad layer and a N-type clad layer, which are superposed on a substrate one on another with a $P^+N^+$-tunnel junction intervening between each pair of the laser structures, the active region of each of the laser structures being not smaller than 10 $\mu$m and not larger than 80 $\mu$m in width, the distance h between the active layers which are most distant from each other in the active layers of the laser structures being not larger than the width W of the active region which is the widest in the laser structures, and the width of said semiconductor laser element being not smaller than W+2h.

It is preferred that heat sinks be provided on both sides of the semiconductor laser element, the laser structure side and the substrate side.

When heat sinks are provided, the thickness of the semiconductor laser element is preferably not larger than 100 μm and more preferably not larger than 80 μm.

Though the high-output semiconductor laser element in accordance with the first aspect of the present invention has a plurality of laser structures or active regions, the peak light intensity at the light exit end face during high power operation can be reduced since the active regions are separated from each other, whereby deterioration of the light exit end face due to photochemical reaction and the like can be suppressed. Further, by limiting the width of the active region of each laser structure to 80 μm, the heat flow parallel to the active layers can be effectively used or the non-light emitting portion can be effectively used as a heat dissipation path, whereby temperature elevation at the end face can be suppressed and deterioration of the laser element during continuous operation can be suppressed.

Further, since the distance h between the active layers which are most distant from each other in the active layers of the laser structures is not larger than the width W of the active region which is the widest in the laser structures (h≦W), the virtual light emitting region, or the light spot, is within the stripe width in both the longitudinal size and the lateral size, whereby the laser element of the first aspect practically arises no problem.

Further, by providing an additional heat sink on the substrate side in addition to the normal heat sink on the epitaxial growth layer side, the heat dissipation effect can be further improved and the temperature elevation during continuous oscillation can be suppressed, whereby reliability at high output power can be improved.

The high-output semiconductor laser element having an active region which is 10 to 80 μm in width is useful as a light source for thermal recording mode in printing to increase the write speed and to lower the sensitivity of the recording medium. Further, when the laser element of the first aspect of the present invention is continuously operated to pump a solid state laser or a fiber laser, higher power pumping light can be output for a given area, the output power of the solid state laser or the fiber laser can be easily increased. For the laser processing field, the medical field and the like, a laser element of high reliability at high output power highly contributes to improving the reliability of the system.

The solid state laser or fiber laser pumping effect can be increased by use of a semiconductor laser which can emit a laser beam in a relatively small beam spot size, about several tens μm. However, laser beams from conventional semiconductor lasers are generally 1 μm at most in vertical width though can be about several tens μm in horizontal width and highly asymmetric in shape. As a pumping laser, in crease in vertical beam diameter within the largest width gives rise to no problem. Further, for such application, it is important to continuously operate at high output power, deterioration of the end face of the element can be suppressed by better use of the horizontal heat dissipation effect when the width of the active region is as small as 10 to 80 μm. Thermal influence when the laser is uncontinuously operated is substantially the same as when the laser is continuously operated except unusual cases where the laser is driven by pulses which is relatively small in duty ratio. For example, the laser is modulated, for instance, in CTP (Computer to Plate) in thermal mode, and pulses of a duty ratio up to several tens % are used in order to generate heat more effectively. In such a case, thermal influence is substantially the same as when the laser is continuously operated. The semiconductor laser element of the first aspect is also useful for such application since it can form an image with a spot diameter of 30 to 80 μm. The laser element of the first aspect is especially useful when the duty ratio is not smaller than 1% or when the pulse width is not smaller than 1 μs where influence of heat is serious.

In accordance with a second aspect of the present invention, there is provided a high-output semiconductor laser element comprising a plurality of laser structures, each comprising at least one active layer interposed between a P-type clad layer and a N-type clad layer, which are superposed on a substrate one on another with a $P^+N^+$-tunnel junction intervening between each pair of the laser structures, the active region of each of the laser structures being not smaller than 10 μm and not larger than 100 μm in width, the distance h between the active layers which are most distant from each other in the active layers of the laser structures being not larger than the virtual width W of the active region of the laser element formed by the active regions of the laser structures, the width of said semiconductor laser element being not smaller than W+2h, and each of the laser structures being provided with at least one of a current-blocking structure and a graded index optical waveguide structure.

The active regions of the laser structures may be in the same position in the direction of width of the laser element or may be in different positions in the direction of width of the laser element within a range of not larger than 100 μm.

The "virtual width W of the active region the laser element" is the width of the active region which is the widest in the laser structures when the active regions of the laser structures are in the same position in the direction of width of the laser element, and is the distance in the direction of width of the laser element between the edges of the active regions which are most distant from each other in the direction of width of the laser element.

It is preferred that the laser structure which is most distant from the substrate in the laser structures be of a ridge optical waveguide type.

The laser structures except the laser structure which is most distant from the substrate in the laser structures may have a plurality of stripe-like active regions.

It is preferred that heat sinks be provided on both sides of the semiconductor laser element, the laser structure side and the substrate side.

When heat sinks are provided, the thickness of the semiconductor laser element is preferably not larger than 100 μm and more preferably not larger than 80 μm.

Though the high-output semiconductor laser element in accordance with the second aspect of the present invention has a plurality of laser structures or active regions, the peak light intensity at the light exit end face during high power operation can be reduced since the active regions are separated from each other, whereby deterioration of the light exit end face due to photochemical reaction and the like can be suppressed. Further, by limiting the width of the active region of each laser structure to 100 μm, the heat flow parallel to the active layers can be effectively used or the non-light emitting portion can be effectively used as a heat dissipation path, whereby temperature elevation at the end face can be suppressed and deterioration of the laser element during continuous operation can be suppressed. This effect is further enhanced when the width of the active region of each laser structure is not larger than 80 μm.

Since each of the laser structures is provided with at least one of a current-blocking structure and a graded index optical waveguide structure, the laser element of the second aspect can produce a high quality laser beam without a kink in the optical output versus current characteristics.

Further, since the distance h between the active layers which are most distant from each other in the active layers of the laser structures is not larger than the virtual width W of the active region of the laser element formed by the active regions of the laser structures (h≦W), the virtual light emitting region, or the light spot, is within a predetermined range in both the longitudinal size and the lateral size, whereby the laser element of the second aspect practically arises no problem.

When the laser structures except the laser structure which is most distant from the substrate in the laser structures have a plurality of stripe-like active regions, the heat flow parallel to the active layers can be effectively used.

Further, by providing an additional heat sink on the substrate side in addition to the normal heat sink on the epitaxial growth layer side, the heat dissipation effect can be further improved and the temperature elevation during continuous oscillation can be suppressed, whereby reliability at high output power can be improved.

The high-output semiconductor laser element having an active region which is 10 to 100 μm in width is useful as a light source for thermal recording mode or as a light source for forming a high quality image in printing to increase the write speed and to lower the sensitivity of the recording medium. Further, when the laser element of the second aspect of the present invention is continuously operated to pump a solid state laser or a fiber laser, it can be a high quality pumping light source free from fluctuation in output power or less in noise. Further, since the laser element of the second aspect can output higher power pumping light for a given area, the output power of the solid state laser or the fiber laser can be easily increased. For the laser processing field, the medical field and the like, a laser element of high reliability at high output power highly contributes to improving the reliability of the system.

The solid state laser or fiber laser pumping effect can be increased by use of a semiconductor laser which can emit a laser beam in a relatively small beam spot size, about several tens μm in diameter. However, laser beams from conventional semiconductor lasers are generally 1 μm at most in vertical width though can be about several tens μm in horizontal width and highly asymmetric in shape. As a pumping laser, increase in vertical beam diameter within the largest width gives rise to no problem. Further, for such application, it is important to continuously operate at high output power, deterioration of the end face of the element can be suppressed by better use of the horizontal heat dissipation effect when the width of the active region is as small as 10 to 100 μm (or 10 to 80 μm). Thermal influence when the laser is uncontinuously operated is substantially the same as when the laser is continuously operated except unusual cases where the laser is driven by pulses which is relatively small in duty ratio. For example, the laser is modulated, for instance, in CTP (Computer to Plate) in thermal mode, and pulses of a duty ratio up to several tens % are used in order to generate heat more effectively. In such a case, thermal influence is substantially the same as when the laser is continuously operated. The semiconductor laser element of the second aspect is also useful for such application since it can form an image with a spot diameter of 30 to 80 μm. The laser element of the second aspect is especially useful when the duty ratio is not smaller than 1% or when the pulse width is not smaller than 1 μs where influence of heat is serious.

In accordance with a third aspect of the present invention, there is provided a high-output semiconductor laser apparatus comprising a semiconductor laser element including a plurality of laser structures which are superposed one on another with a $P^+N^+$-tunnel junction intervening between each pair of the laser structures, each of the laser structures comprising at least one active layer interposed between a P-type clad layer and a N-type clad layer and at least two of the laser structures being spaced from each other by a substrate, and a pair of heat sinks which are respectively provided on the upper and lower surface of the semiconductor laser element, the active region of each of the laser structures being not smaller than 30 μm and not larger than 500 μm in width, and the distance between the active layers which are most distant from each other in the active layers of the laser structures being not larger than the virtual width of the active region of the laser element formed by the active regions of the laser structures.

The active regions of the laser structures may be in the same position in the direction of width of the laser element or may be in different positions in the direction of width of the laser element within a range of not larger than 500 μm.

The "virtual width of the active region the laser element" is the width of the active region which is the widest in the laser structures when the active regions of the laser structures are in the same position in the direction of width of the laser element, and is the distance in the direction of width of the laser element between the edges of the active regions which are most distant from each other in the direction of width of the laser element.

It is preferred that each of the laser structures be provided with at least one of a current-blocking structure and a graded index optical waveguide structure.

In accordance with a fourth aspect of the present invention, there is provided a method of manufacturing the laser apparatus of the third aspect of the present invention comprising the steps of forming a semiconductor laser element by separately forming a plurality of laser structures, each comprising a P-type clad layer, a N-type clad layer and at least one active layer interposed therebetween which are superposed on a substrate, each of the active regions being not smaller than 30 μm and not larger than 500 μm in width, forming a $p^+$-semiconductor layer and an $n^+$-semiconductor layer on the uppermost layer of predetermined one of the laser structures and bonding the side of the superposed layers of the predetermined laser structure to the lower surface of the substrate of one of the other laser structures, and providing a pair of heat sinks respectively on the upper and lower surfaces of the laser element.

Though the high-output semiconductor laser apparatus in accordance with the third aspect of the present invention has a plurality of laser structures or active regions, the peak light intensity at the light exit end face during high power operation can be reduced since the active regions are separated from each other, whereby deterioration of the light exit end face due to photochemical reaction and the like can be suppressed.

Since each of the laser structures is provided with at least one of a current-blocking structure and a graded index optical waveguide structure, the laser apparatus of the third aspect can produce a high quality laser beam without a kink in the optical output versus current characteristics.

By inserting a substrate between the active layers, the distance between the active layers can be easily enlarged, which contributes to reduction of light density and enhancement in heat dissipation effect.

Further, since the distance between the active layers which are most distant from each other in the active layers of the laser structures is not larger than the virtual width of the active region of the laser element formed by the active regions of the laser structures, the virtual light emitting region, or the light spot, is within a predetermined range in both the longitudinal size and the lateral size, whereby the laser apparatus of the third aspect practically arises no problem.

Further, since heat sinks are provided both on the upper and lower sides of the laser element, the heat dissipation effect can be further improved and the temperature elevation during continuous oscillation can be suppressed, whereby reliability at high output power can be improved.

In accordance with the method of manufacturing a laser apparatus, a laser apparatus can be manufactured in a shorter time as compared with when the layers are formed in sequence by crystal growth or the like. Further, by inserting a substrate between the active layers, the distance between the active layers can be easily enlarged, a laser apparatus can be manufactured in a shorter time as compared with when the layers are grown to enlarge the distance between the active layers.

BRIEF DESCRIPTION OF THE DRAWINGS

FIG. 6 is a schematic cross-sectional view showing a semiconductor laser element in accordance with a fourth embodiment of the present invention, FIG. 7 is a schematic cross-sectional view showing a conventional ridge-optical waveguide type semiconductor laser element, FIG. 13 is a schematic cross-sectional view showing a semiconductor laser element in accordance with a seventh embodiment of the present invention, FIG. 19 is a schematic cross-sectional view showing the semiconductor laser element in accordance with the tenth embodiment of the present invention in the course of manufacture, FIG. 24 is a schematic cross-sectional view showing the semiconductor laser element in accordance with the eleventh embodiment of the present invention.

DESCRIPTION OF THE PREFERRED EMBODIMENTS

Figure 1:
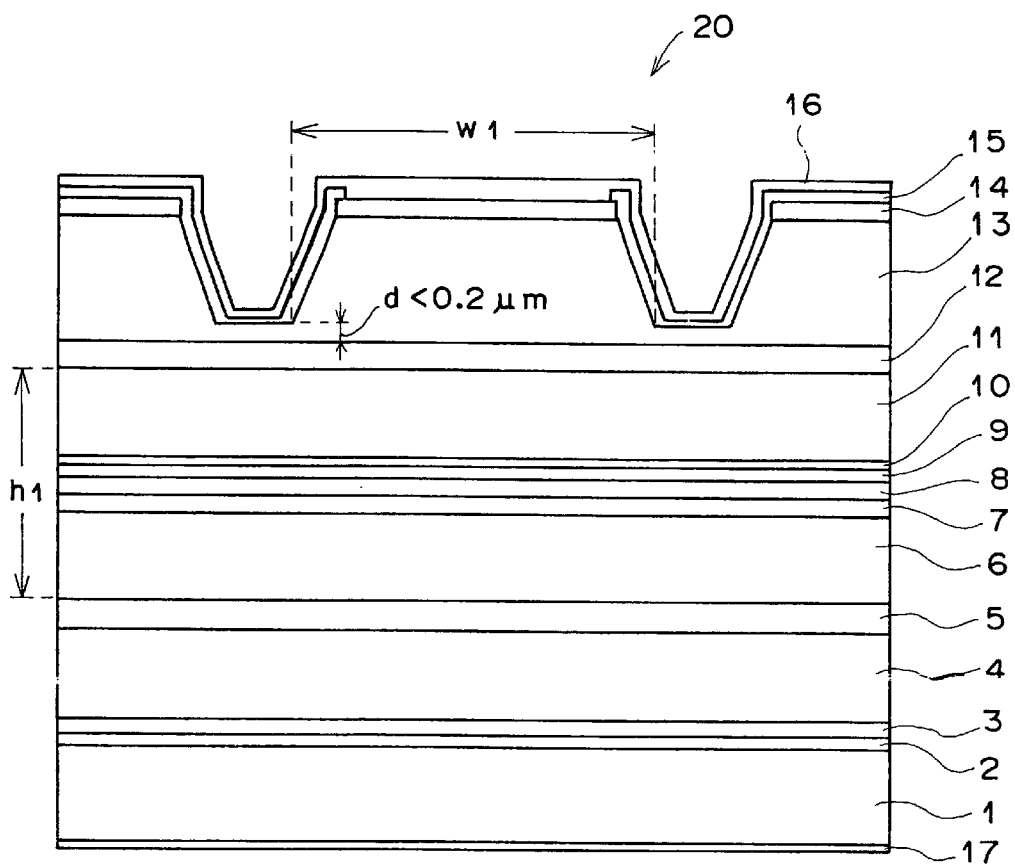
FIG. 1 is a schematic cross-sectional view showing a semiconductor laser element in accordance with a first embodiment of the present invention.

A semiconductor laser element in accordance with a first embodiment of the present invention will be described referring to a procedure of manufacturing the same with reference to FIG. 1.

An n-GaAs buffer layer 2 (doped with $5\times10^{17}/cm^3$ of Si, 0.5 $\mu$m in thickness), an n-$Al_xGa_{1-x}As$ graded buffer layer 3 (doped with $5\times10^{17}/cm^3$ of Si, 0.2 $\mu$m in thickness and x standing for a value which gradually increases from 0.1 to 0.63), an n-$Al_{0.63}Ga_{0.37}As$ clad layer 4 (doped with $5\times10^{17}/cm^3$ of Si, 1.5 $\mu$m in thickness), an SCH active layer 5, a p-$Al_{0.63}Ga_{0.37}As$ clad layer 6 (doped with $7\times10^{17}/cm^{-3}$ of Zn, 2 $\mu$m in thickness), a $p^+$-GaAs layer 7 (doped with $2\times10^{19}/cm^3$ of Zn, 0.1 $\mu$m in thickness), an $n^+$-GaAs layer 8

(doped with $2\times10^{18}/cm^3$ of Si, 0.1 μm in thickness), an n-GaAs buffer layer 9 (doped with $5\times10^{17}/cm^3$ of Si, 0.5 μm in thickness), an n-$Al_xGa_{1-x}As$ graded buffer layer 10 (doped with $5\times10^{17}/cm^3$ of Si, 0.2 μm in thickness and x standing for a value which gradually increases from 0.1 to 0.63), an n-$Al_{0.63}Ga_{0.37}As$ clad layer 11 (doped with $5\times10^{17}/cm^3$ of Si, 2.0 μm in thickness), an SCH active layer 12, a p-$Al_{0.63}Ga_{0.37}As$ clad layer 13 (doped with $7\times10^{17}/cm^3$ of Zn, 2 μm in thickness) and a p-GaAs capping layer 14 (doped with $2\times10^{19}/cm^3$ of Zn, 0.1 μm in thickness) are formed on an n-GaAs substrate 1 (doped with $2\times10^{18}/cm^3$ of Si) in this order by vacuum MOCVD (metal organic chemical vapor deposition). Each of the SCH active layers 5 and 12 comprises an n-$In_{0.48}Ga_{0.52}P$ optical waveguide layer (doped with $5\times10^{17}/cm^3$ of Si, 0.3 μm in thickness), an $In_{0.48}Ga_{0.52}P$ optical waveguide layer (undoped, 0.1 μm in thickness), an $In_{0.13}Ga_{0.87}As_{0.75}P_{0.25}$ quantum-well layer (undoped, 10 nm in thickness), an $In_{0.48}Ga_{0.52}P$ optical waveguide layer (undoped, 0.1 μm in thickness) and a p-$In_{0.48}Ga_{0.52}P$ optical waveguide layer (doped with $5\times10^{17}/cm^3$ of Zn, 0.3 μm in thickness).

Then a pair of stripe-like grooves each 10 μm in width are formed by photolithography and chemical etching using a mixed solution of $H_2SO_4:H_2O_2:H_2O=20:1:1$, thereby forming between the grooves a ridge stripe structure which is 50 μm in width w1 as measured at the base thereof. At this time, the p-$Al_{0.63}Ga_{0.37}As$ clad layer 13 in the grooves is etched to a thickness (d) not larger than 0.2 μm. The p-$Al_{0.63}Ga_{0.37}As$ clad layer 13 in the grooves may be etched up to the SHG active layer 12 under the clad layer 13.

Then a $SiO_2$ insulating layer 15 is formed by plasma CVD, and the $SiO_2$ insulating layer 15 is removed from the upper surface of the mesa in the zones between 1 μm inward the opposite side edges of the mesa and 5 μm inward the opposite side edges of the mesa by etching using diluted HF and photolithography.

Thereafter a p-side electrode (Ti/Pt/Ti/Pt/Au) 16 is formed by vapor deposition and heat-treatment, and the bottom surface of the n-GaAs substrate 1 is ground to thin the substrate 1 to such an extent that the overall thickness becomes about 100 μm. Finally an n-side electrode (AuGe/Ni/Au) 17 is formed by vapor deposition and heat-treatment.

From the wafer thus obtained, a laser bar about 1 cm in length and 1.5 mm in resonator length is cut by scribing and cleavage with a diamond needle. Then the light exit end face is coated with an optical film which is 8% in reflectivity and the rear face is coated with an optical film which is not lower than 95% in reflectivity.

Further, from the laser bar, a laser chip 20 about 500 μm in width is cut by scribing and cleavage with a diamond needle.

Figure 2:
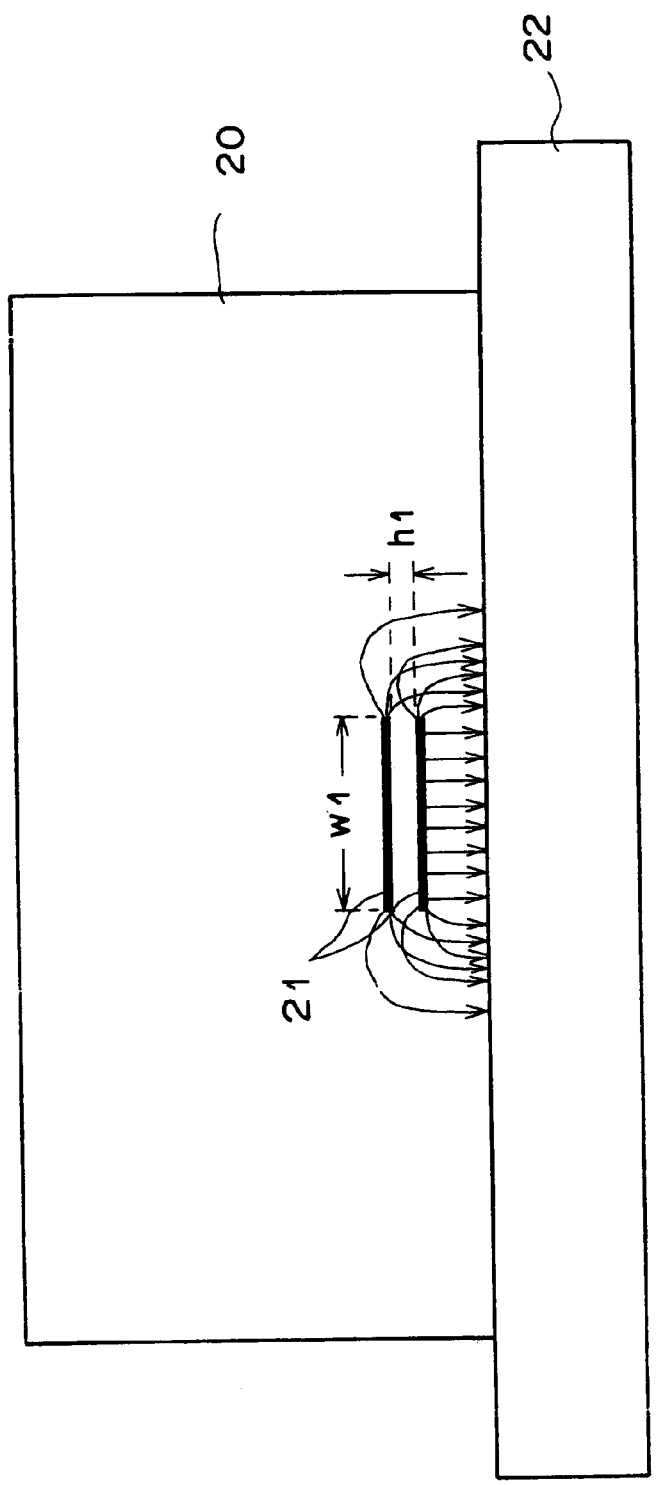
FIG. 2 is a schematic view for illustrating the heat flow from the active region in the semiconductor laser of the first embodiment.

Then the p-side electrode 16 is bonded to a copper block (heat sink) 22 with In solder (4 to 5 μm thick) as shown in FIG. 2.

The semiconductor laser element of this embodiment manufactured in the manner described above oscillates at about 809 nm with a threshold current of about 300 mA and can continuously operates at high output power not lower than 5 w at room temperature.

FIG. 7 is a cross-sectional view of a conventional semiconductor laser element. In FIG. 7, the elements analogous to those shown in FIG. 1 are given the same reference numerals. The conventional semiconductor laser has only one active region, is as low as about 3.6 W in maximum output power, and is 1.5 w at highest in working output power where reliability can be ensured. To the contrast, the laser element of this embodiment is not lower than 5 w in maximum output power and is not lower than 2 w in working output power.

Heat flow in the semiconductor laser element of this embodiment is schematically shown in FIG. 2. In FIG. 2, the laser chip 20 shown in FIG. 1 is shown upside down and only the active region 21 is shown as for the laser chip 20. The flow of heat generated in the active region 21 is shown by arrows in FIG. 2. These inventor's investigation has revealed that heat flow in horizontal directions from the active region 21 is effective to heat dissipation when the stripe width is not larger than about 100 μm. (See "Appl. Phys. Lett. vol. 75, No. 13, p. 1839 (1999) by T. Hayakawa) Accordingly, in the case where a plurality of active regions which are relatively small in stripe width are superposed spaced from each other in the direction of the growth layer as in this embodiment, heat dissipation effect of the lateral heat flow becomes more effective as the distance of the active region from the heat sink 22 increases, and in the laser chip 20 of this embodiment, heat dissipation can be improved as a whole by an amount corresponding to the extent to which the active regions (heat generating portions) are dispersed. Further when the distance h1 between the active layers is smaller than the maximum stripe width w1, the virtual light emitting region cannot exceed the stripe width and accordingly, so long as the distance h1 between the active layers is smaller than the maximum stripe width w1, the wide stripe multiple transverse mode high-output semiconductor laser element practically arises no problem.

Figure 3:
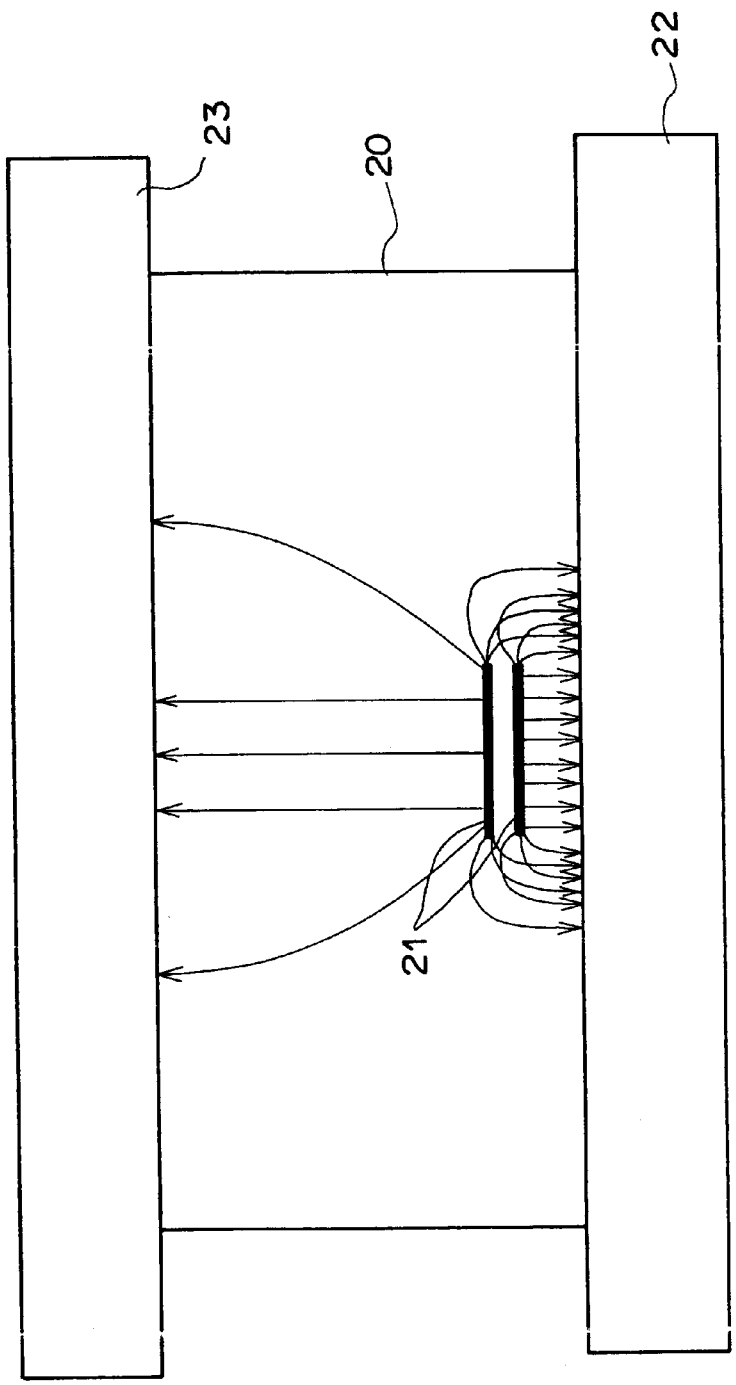
FIG. 3 is a schematic view for illustrating the heat flow from the active region in the semiconductor laser of the first embodiment when a heat sink is provided on each side of the laser element.

Further, when an additional heat sink 23 is provided on the substrate side in addition to the heat sink 22 on the epitaxial growth layer side as shown in FIG. 3, the heat can be more effectively dissipated from the active layers. Especially when the distance h1 between the active layers is made larger (h1≦w1) and the ground thickness of the chip is made smaller, heat dissipation effect is further improved. Preferably the ground thickness is not larger than 100 μm and more preferably not larger than 80 μm. The ground thickness is a thickness of the laser element which adjusted by grinding the substrate.

A semiconductor laser element in accordance with a second embodiment of the present invention will be described referring to a procedure of manufacturing the same with reference to FIG. 4.

An n-GaAs buffer layer 32 (doped with $1\times10^{18}/cm^3$ of Si, 0.5 μm in thickness), an n-$Al_xGa_{1-x}As$ graded buffer layer 33 (doped with $5\times10^{17}/cm^3$ of Si, 0.2 μm in thickness and x standing for a value which gradually increases from 0.1 to 0.5), an n-$Al_{0.5}Ga_{0.5}As$ clad layer 34 (doped with $5\times10^{17}/cm^3$ of Si, 1.5 μm in thickness), an SCH active layer 35, a p-$Al_{0.5}Ga_{0.5}As$ clad layer 6 (doped with $7\times10^{17}/cm^3$ of Zn, 2 μm in thickness), a $p^+$-GaAs layer 37 (doped with $2\times10^{19}/cm^3$ of Zn, 0.1 μm in thickness), an $n^+$-GaAs layer 38 (doped with $2\times10^{18}/cm^3$ of Si, 0.1 μm in thickness), an n-GaAs buffer layer 39 (doped with $5\times10^{17}/cm^3$ of Si, 0.5 μm in thickness), an n-$Al_xGa_{1-x}As$ graded buffer layer 40 (doped with $5\times10^{17}/cm^3$ of Si, 0.2 μm in thickness and x standing for a value which gradually increases from 0.1 to 0.5), an n-$Al_{0.5}Ga_{0.5}As$ clad layer 41 (doped with $5\times10^{17}/cm^3$ of Si, 2.0 μm in thickness), an SCH active layer 42, a p-$Al_{0.5}Ga_{0.5}As$ clad layer 43 (doped with $7\times10^{17}/cm^3$ of Zn, 2 μm in thickness) and a p-GaAs capping layer 44 (doped with $2\times10^{19}/cm^3$ of Zn, 0.1 μm in thickness) are formed on an n-GaAs substrate 31 (doped with $2\times10^8/cm^3$ of Si) in this order by MOCVD growth. Each of the SCH active layers 35 and 42 comprises an $Al_{0.3}Ga_{0.7}As$ optical waveguide layer (undoped, 0.3 μm in thickness), an $Al_{0.08}Ga_{0.92}As$ quantum-well layer (undoped, 10 nm in thickness), an $In_{0.48}Ga_{0.52}P$ optical waveguide layer (undoped, 0.1 μm in thickness) and an $Al_{0.3}Ga_{0.7}As$ optical waveguide layer (undoped, 0.3 μm in thickness).

Then a $SiO_2$ insulating layer 45 is formed by plasma CVD, and the $SiO_2$ insulating layer 45 is removed in a pattern of a stripe 60 μm wide (w2=60 μm) by etching using diluted HF and photolithography.

Thereafter in the same manner as in the first embodiment, a p-side electrode (Ti/Pt/Ti/Pt/Au) 46 is formed, the bottom surface of the substrate 31 is ground, an n-side electrode (AuGe/Ni/Au) 47 is formed. From the wafer thus obtained, a laser bar is cut, the light exit end face is coated and a laser chip is cut in the same manner as in the first embodiment, whereby a laser chip is obtained.

Figure 5:
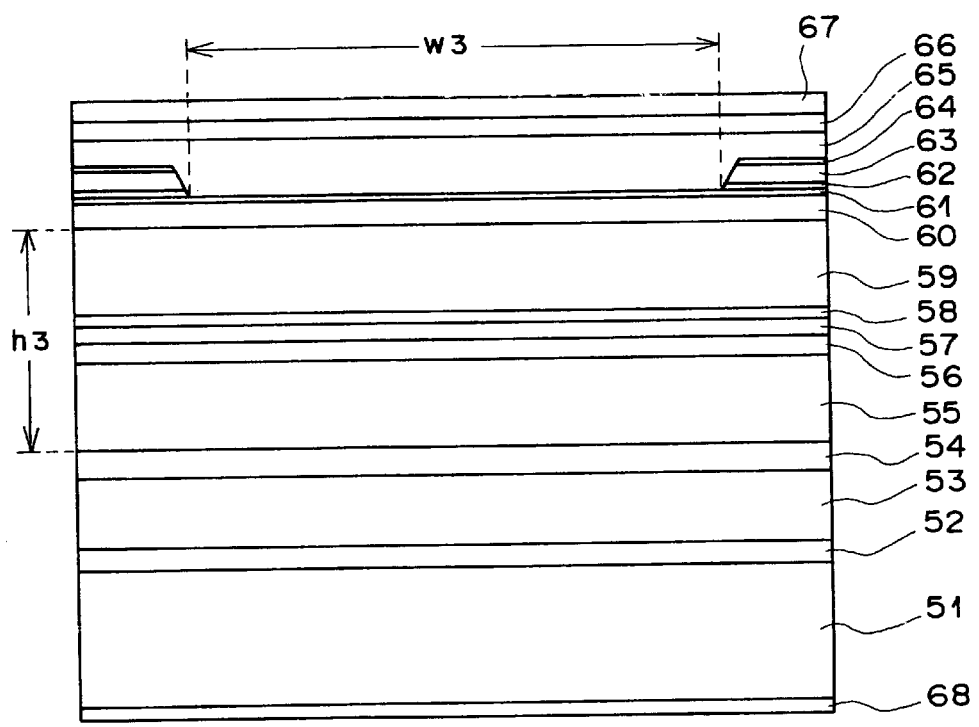
FIG. 5 is a schematic cross-sectional view showing a semiconductor laser element in accordance with a third embodiment of the present invention.

A semiconductor laser element in accordance with a third embodiment of the present invention will be described referring to a procedure of manufacturing the same with reference to FIG. 5.

The semiconductor laser element is manufactured by first and second vacuum MOCVD growth procedures. In first vacuum MOCVD growth procedure, an n-GaAs buffer layer 52 (doped with $1\times10^{18}/cm^3$ of Si, 0.5 μm in thickness), an n-$In_{0.48}Ga_{0.52}P$ clad layer 53 (doped with $1\times10^{18}/cm^3$ of Si, 1.5 μm in thickness), an SCH active layer 54, a p-$In_{0.48}Ga_{0.52}P$ clad layer 55 (doped with $1\times10^{18}/cm^3$ of Zn, 1.5 μm in thickness), a $p^+$-GaAs layer 56 (doped with $2\times10^{19}/cm^3$ of Zn, 0.1 μm in thickness), an $n^+$-GaAs layer 57 (doped with $2\times10^{18}/cm^3$ of Si, 0.1 μm in thickness), an n-GaAs buffer layer 58 (doped with $5\times10^{17}/cm^3$ of Si, 0.5 μm in thickness), an n-$In_{0.48}Ga_{0.52}P$ clad layer 59 (doped with $1\times10^{18}/cm^3$ of Si, 1.5 μm in thickness), an SCH active layer 60, a p-$In_{0.48}Ga_{0.52}P$ clad layer 61 (doped with $1\times10^{18}/cm^3$ of Zn, 0.2 μm in thickness), an n-GaAs layer 62 (doped with $7\times10^{17}/cm^3$ of Si, 10 nm in thickness), an n-$In_{0.48}(Ga_{0.7}Al_{0.3})_{0.52}P$ current-blocking layer 63 (doped with $2\times10^{18}/cm^3$ of Si, 0.8 μm in thickness), and an n-GaAs layer 64 (doped with $7\times10^{17}/cm^3$ of Si, 10 nm in thickness) are formed on an n-GaAs substrate 51 (doped with $2\times10^{18}/cm^3$ of Si) in this order. Each of the SCH active layers 54 and 60 comprises an $In_{0.1}Ga_{0.9}As_{0.8}P_{0.2}$ optical waveguide layer (undoped, 0.3 μm in thickness), an $Al_{0.8}Ga_{0.92}As$ quantum-well layer (undoped, 0.08 μm in thickness), a $GaAs_{0.8}P_{0.2}$ tensile-strained barrier layer (undoped, 10 nm in thickness), an $In_{0.28}Ga_{0.72}As$ compressive-strained quantum-well layer (undoped, 7 nm in thickness), a $GaAs_{0.8}P_{0.2}$ tensile-strained barrier layer (undoped, 10 nm in thickness) and an $In_{0.1}Ga_{0.9}As_{0.8}P_{0.2}$ optical waveguide layer (undoped, 0.08 μm in thickness).

Then a stripe groove which is 80 μm in width w3 as measured at the bottom thereof (w3=80 μm) is formed in the n-GaAs layer 64 by photolithography and chemical etching using a mixed solution of $H_2SO_4$, $H_2O_2$ and $H_2O$.

Then then-$In_{0.48}(Ga_{0.7}Al_{0.3})_{0.52}P$ current-blocking layer 63 is etched with HCl and the n-GaAs layer 62 is etched with mixed solution of $H_2SO_4$, $H_2O_2$ and $H_2O$.

Then over the layers thus formed, in second vacuum MOCVD growth procedure, a p-$In_{0.48}Ga_{0.52}P$ clad layer 65 (doped with $1\times10^{18}/cm^3$ of Zn, 1.8 μm in thickness) and a p-GaAs capping layer 66 (doped with $2\times10^{19}/cm^3$ of Zn, 0.2 μm in thickness) are superposed.

Thereafter in the same manner as in the first embodiment, a p-side electrode (Ti/Pt/Ti/Pt/Au) 67 is formed, the bottom surface of the substrate 51 is ground, an n-side electrode (AuGe/Ni/Au) 68 is formed. From the wafer thus obtained, a laser bar is cut, the light exit end face is coated and a laser chip is cut in the same manner as in the first embodiment, whereby a laser chip is obtained.

A semiconductor laser element in accordance with a fourth embodiment of the present invention will be described referring to a procedure of manufacturing the same with reference to FIG. 6.

Figure 4:
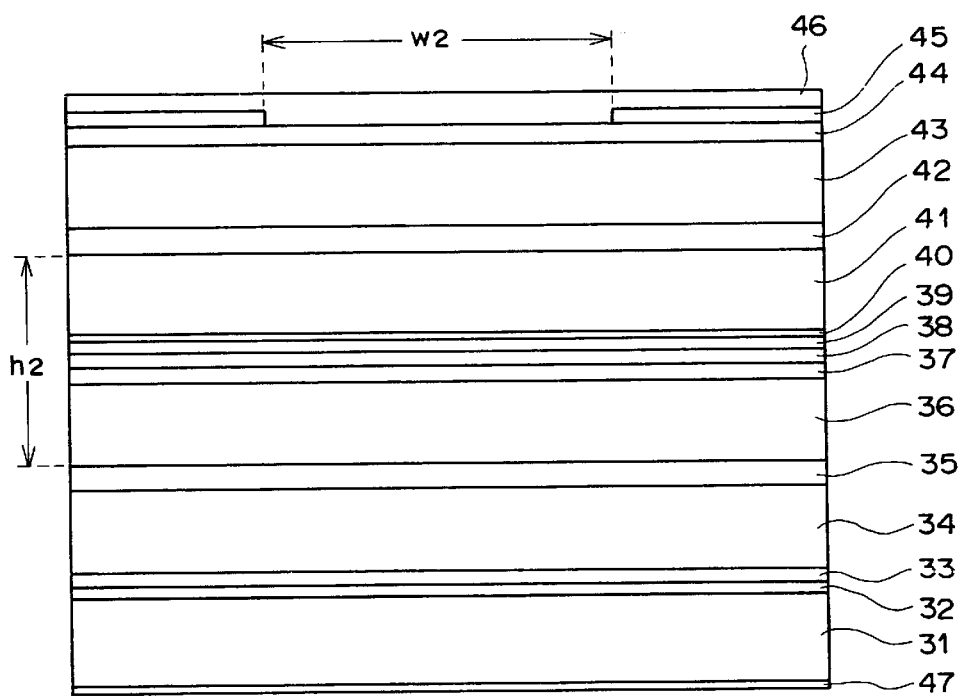
FIG. 4 is a schematic cross-sectional view showing a semiconductor laser element in accordance with a second embodiment of the present invention.

The same layers as in the second embodiment shown in FIG. 4 are formed by MOCVD growth. The elements analogous to those in the second embodiment are given the same reference numerals in FIG. 6, and will not be described here. Then $SiN_x$ layer is formed over a region corresponding to a stripe width of w4 (=40 μm) by plasma CVD, photolithography and etching. Thereafter, protons are injected by ion injection into a region other than the stripe region through an ion injection portion 70, and after damage is recovered by thermal anneal, an $SiN_x$ insulating layer 71 is formed over the ion injection portion 70 by plasma CVD. Then a stripe-like window 40 μm wide is formed by photolithography and etching.

Thereafter in the same manner as in the first embodiment, a p-side electrode (Ti/Pt/Ti/Pt/Au) 72 is formed, the bottom surface of the substrate is ground, an n-side electrode (AuGe/Ni/Au) 73 is formed. From the wafer thus obtained, a laser bar is cut, the light exit end face is coated and a laser chip is cut in the same manner as in the first embodiment, whereby a laser chip is obtained.

When the semiconductor laser elements in accordance with the second to fourth embodiments of the present invention are provided with heat sinks both on the substrate side and on the growth layer side, the heat dissipation effect can be further improved and reliability at high output power can be improved.

The stripe widths of the semiconductor laser elements w2 to w4 are in the range of 10 to 80 μm, and the distance h (h2, h3, h4) between the active layers in each semiconductor laser element is smaller than the stripe width. Preferably the thickness of the laser element is not larger than 100 μm and more preferably not larger than 80 μm. The width of each laser element is about 500 μm and is not smaller than W+2h.

Though properties upon continuous operation at a constant output have been described above, the laser elements of the first to fourth embodiments exhibit the similar properties even when the intensity of the output light is modulated.

Further, though the laser elements in accordance with the first to fourth embodiments described above have only two superposed active regions, three or more active regions may be superposed with a $P^+N^+$-tunnel junction intervening between each pair of the laser structures. Further, each active region may be of a multiquantum-well structure comprising a plurality of quantum-wells. Further, the first aspect of the present invention may be applied to various semiconductor lasers such as InGaAlP 600 nm-band lasers, 1.3 to 1.6 μm-band lasers with an InP substrate, InGaN lasers and the like.

Figure 8:
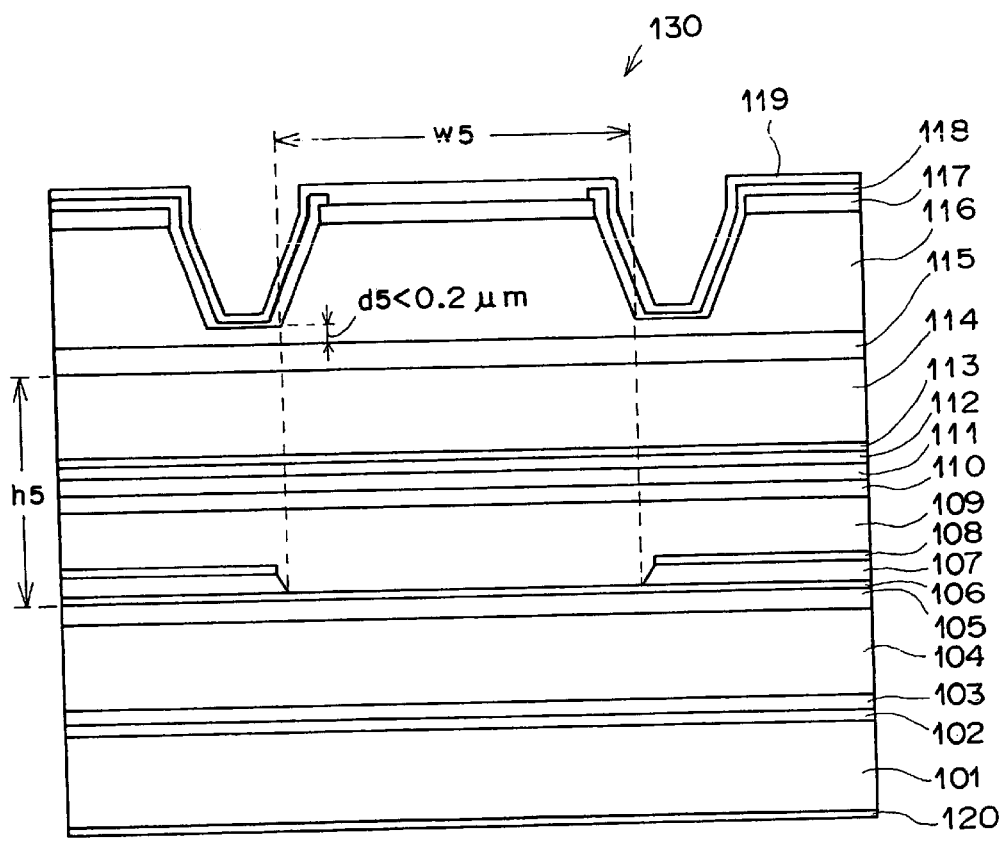
FIG. 8 is a schematic cross-sectional view showing a semiconductor laser element in accordance with a fifth embodiment of the present invention.

A semiconductor laser element in accordance with a fifth embodiment of the present invention will be described referring to a procedure of manufacturing the same with reference to FIG. 8.

The semiconductor laser element is manufactured by first and second vacuum MOCVD growth procedures. In first vacuum MOCVD growth procedure, an n-GaAs buffer layer 102 (doped with $5\times10^{17}/cm^3$ of Si, 0.5 μm in thickness), an n-$Al_xGa_{1-x}As$ graded buffer layer 103 (doped with $5\times10^{17}/cm^3$ of Si, 0.2 μm in thickness and x standing for a value which gradually increases from 0.1 to 0.63), an n-$Al_{0.63}Ga_{0.37}As$ clad layer 104 (doped with $5 \times 10^{17}/cm^3$ of Si, 1.5 μm in thickness), an SCH active layer 105, a p-GaAs layer 106 (doped with $7 \times 10^{17}/cm^3$ of Zn, 4 nm in thickness), an n-$Al_{0.7}Ga_{0.3}As$ current-blocking layer 107 (doped with $8 \times 10^{17}/cm^3$ of Si, 0.8 μm in thickness) and an n-GaAs layer 108 (doped with $8 \times 10^{17}/cm^3$ of Si, 10 nm in thickness) are formed on an n-GaAs substrate 101 (doped with $2 \times 10^{18}/cm^3$ of Si) in this order.

Then a stripe groove which is 60 μm in width w5 as measured at the bottom thereof is formed in the n-GaAs layer 108 by photolithography and chemical etching using a mixed solution of $NH_4OH$, $H_2O_2$ and $H_2O$, and then then-$Al_{0.7}Ga_{0.3}As$ current-blocking layer 107 is etched with diluted HF.

Then over the layers thus formed, in second vacuum MOCVD growth procedure, a p-$Al_{0.63}Ga_{0.37}As$ clad layer 109 (doped with $7 \times 10^{17}/cm^3$ of Zn, 2 μm in thickness), a $p^+$-GaAs layer 110 (doped with $2 \times 10^{19}/cm^3$ of Zn, 0.1 μm in thickness), an $n^+$-GaAs layer 111 (doped with $2 \times 10^{18}/cm^3$ of Si, 0.1 μm in thickness), an n-GaAs buffer layer 112 (doped with $5 \times 10^{17}/cm^3$ of Si, 0.5 μm in thickness), an n-$Al_xGa_{1-x}$As graded buffer layer 113 (doped with $5 \times 10^{17}/cm^3$ of Si, 0.2 μm in thickness and x standing for a value which gradually increases from 0.1 to 0.63), an n-$Al_{0.63}Ga_{0.37}As$ clad layer 114 (doped with $5 \times 10^{17}/cm^3$ of Si, 2.0 μm in thickness), an SCH active layer 115, a p-$Al_{0.63}Ga_{0.37}As$ clad layer 116 (doped with $7 \times 10^{17}/cm^3$ of Zn, 2 μm in thickness) and a p-GaAs capping layer 117 (doped with $2 \times 10^{19}/cm^3$ of Zn, 0.1 μm in thickness) are superposed.

Each of the SCH active layers 105 and 115 comprises an $In_{0.48}Ga_{0.52}P$ optical waveguide layer (doped with $5 \times 10^{17}/cm^3$ of Si, 0.3 μm in thickness), an $In_{0.48}Ga_{0.52}P$ optical waveguide layer (undoped, 0.1 μm in thickness), an $Al_{0.13}Ga_{0.87}As_{0.75}P_{0.25}$ quantum-well layer (undoped, 10 nm in thickness), an $In_{0.48}Ga_{0.52}P$ optical waveguide layer (undoped, 0.1 μm in thickness) and an $In_{0.48}Ga_{0.52}P$ optical waveguide layer (doped with $7 \times 10^{17}/cm^3$ of Zn, 0.3 μm in thickness).

Then a pair of stripe-like grooves each 10 μm in width are formed by photolithography and chemical etching using a mixed solution of $H_2SO_4:H_2O_2:H_2O=20:1:1$, thereby forming between the groves a ridge stripe structure which is 60 μm in width w1 as measured at the base thereof. At this time, the p-$Al_{0.63}Ga_{0.37}As$ clad layer 116 in the grooves is etched to a thickness (d5) not larger than 0.2 μm. The p-$Al_{0.63}Ga_{0.37}As$ clad layer 116 in the grooves may be etched up to the SHG active layer 115 under the clad layer 116.

Then a $SiO_2$ insulating layer 118 is formed by plasma CVD, and the $SiO_2$ insulating layer 118 is removed from the upper surface of the mesa in the zones between 1 μm inward the opposite side edges of the mesa and 5 μm inward the opposite side edges of the mesa by etching using diluted HF and photolithography.

Thereafter a p-side electrode (Ti/Pt/Ti/Pt/Au) 119 is formed by vapor deposition and heat-treatment, and the bottom surface of the n-GaAs substrate 101 is ground to thin the substrate 101 to such an extent that the overall thickness becomes about 100 μm. Finally an n-side electrode (AuGe/Ni/Au) 120 is formed by vapor deposition and heat-treatment. From the wafer thus obtained, a laser bar about 1 cm in length and 1.5 mm in resonator length is cut by scribing and cleavage with a diamond needle. Then the light exit end face is coated with an optical film which is 8% in reflectivity and the rear face is coated with an optical film which is not lower than 95% in reflectivity. Further, from the laser bar, a laser chip 130 about 500 μm in width is cut by scribing and cleavage with a diamond needle. Then the p-side electrode 119 is bonded to a copper block (heat sink) 132 with In solder (4 to 5 μm thick) as shown in FIG. 9.

The semiconductor laser element of this embodiment manufactured in the manner described above oscillates at about 809 nm with a threshold current of about 150 mA and can continuously operates at high output power not lower than 5 w at room temperature without a kink in the optical output versus current characteristics. In this embodiment, since the widths of the twp active regions are limited to 60 μm by the graded index optical waveguide structure and the current blocking structure, each active region emits light in a square pattern in the horizontal direction.

Further, in this particular embodiment, by employing a ridge optical waveguide laser structure as the uppermost laser structure, a graded index optical waveguide current blocking structure can be incorporated in each of the two active regions by only two MOCVD growths, whereby manufacturing procedure can be simplified.

Figure 9:
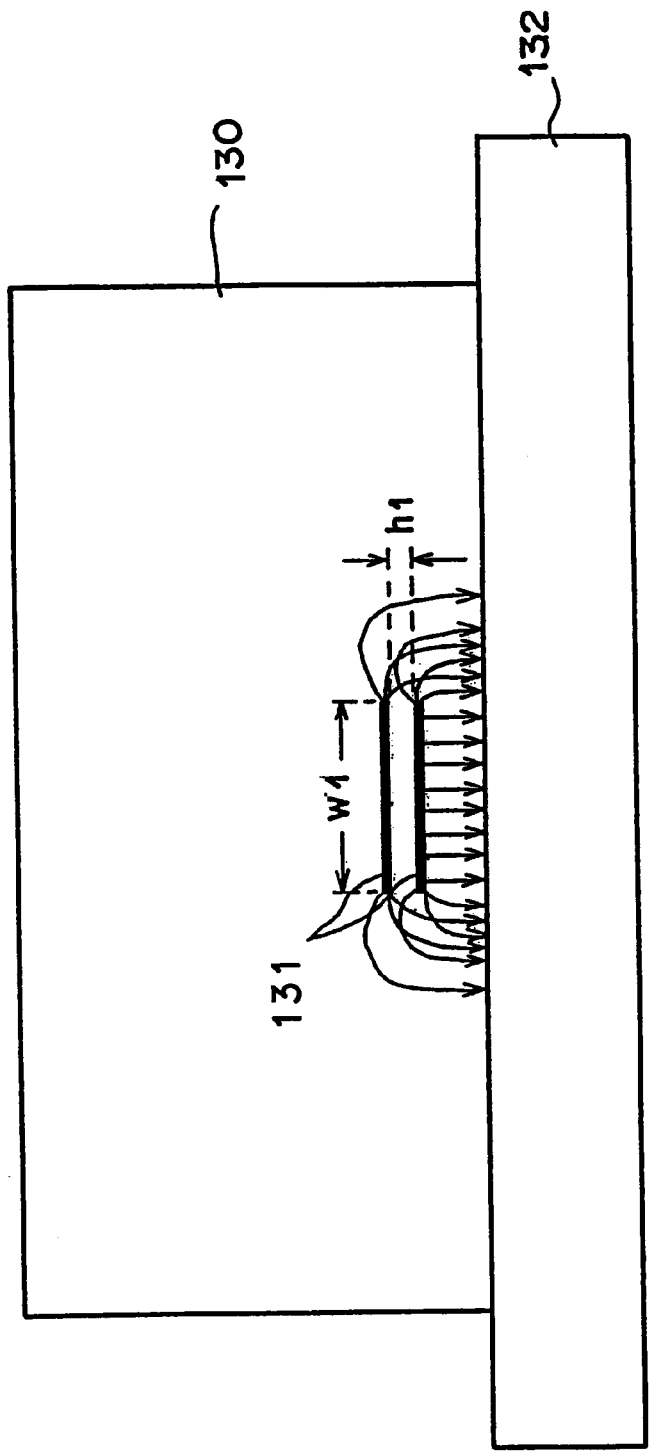
FIG. 9 is a schematic view for illustrating the heat flow from the active region in the semiconductor laser of the fifth embodiment.

Heat flow in the semiconductor laser element of this embodiment is schematically shown in FIG. 9. In FIG. 9, the laser chip 130 shown in FIG. 8 is shown upside down and only the active region 131 is shown as for the laser chip 130. The flow of heat generated in the active region 131 is shown by arrows in FIG. 9. These inventor's investigation has revealed that heat flow in horizontal directions from the active region 131 is very effective to heat dissipation when the stripe width is not larger than about 100 μm. (See "Appl. Phys. Lett. vol. 75, No. 13, p. 1839 (1999) by T. Hayakawa) Accordingly, in the case where a plurality of active regions which are relatively small in stripe width are superposed spaced from each other in the direction of the growth layer as in this embodiment, heat dissipation effect of the lateral heat flow becomes more effective as the distance of the active region from the heat sink 132 increases, and in the laser chip 130 of this embodiment, heat dissipation can be improved as a whole by an amount corresponding to the extent to which the active regions (heat generating portions) are dispersed. Further when the distance h5 between the active layers is smaller than the maximum stripe width w5, the virtual light emitting region cannot exceed the stripe width and accordingly, so long as the distance h5 between the active layers is smaller than the maximum stripe width w5, the wide stripe multiple transverse mode high-output semiconductor laser element practically arises no problem.

Figure 10:
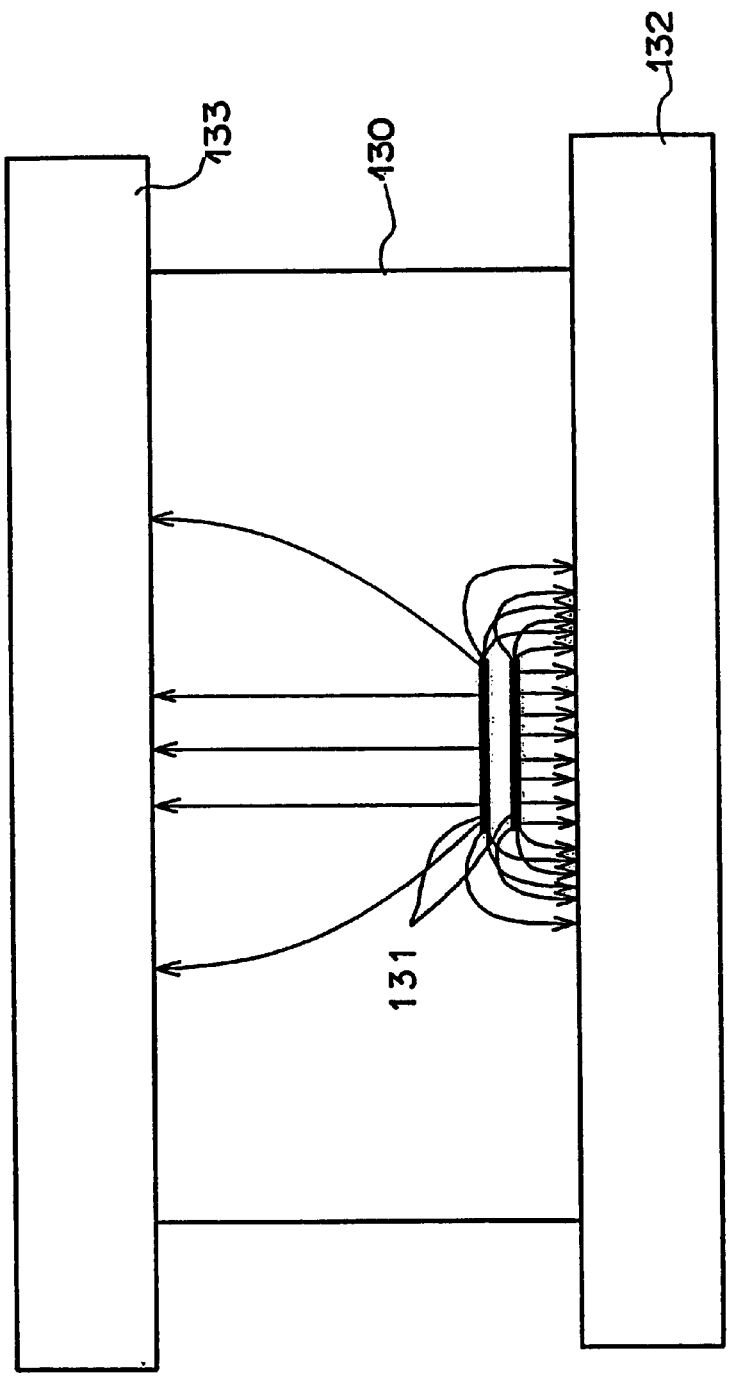
FIG. 10 is a schematic view for illustrating the heat flow from the active region in the semiconductor laser of the fifth embodiment when a heat sink is provided on each side of the laser element.

Further, when an additional heat sink 133 is provided on the substrate side in addition to the heat sink 132 on the epitaxial growth layer side as shown in FIG. 10, the heat can be more effectively dissipated from the active layers. Especially when the distance h5 between the active layers is made larger (h5≦w5) and the ground thickness of the chip is made smaller, heat dissipation effect is further improved. Preferably the ground thickness is not larger than 100 μm and more preferably not larger than 80 μm. The ground thickness is a thickness of the laser element which adjusted by grinding the substrate.

Figure 11:
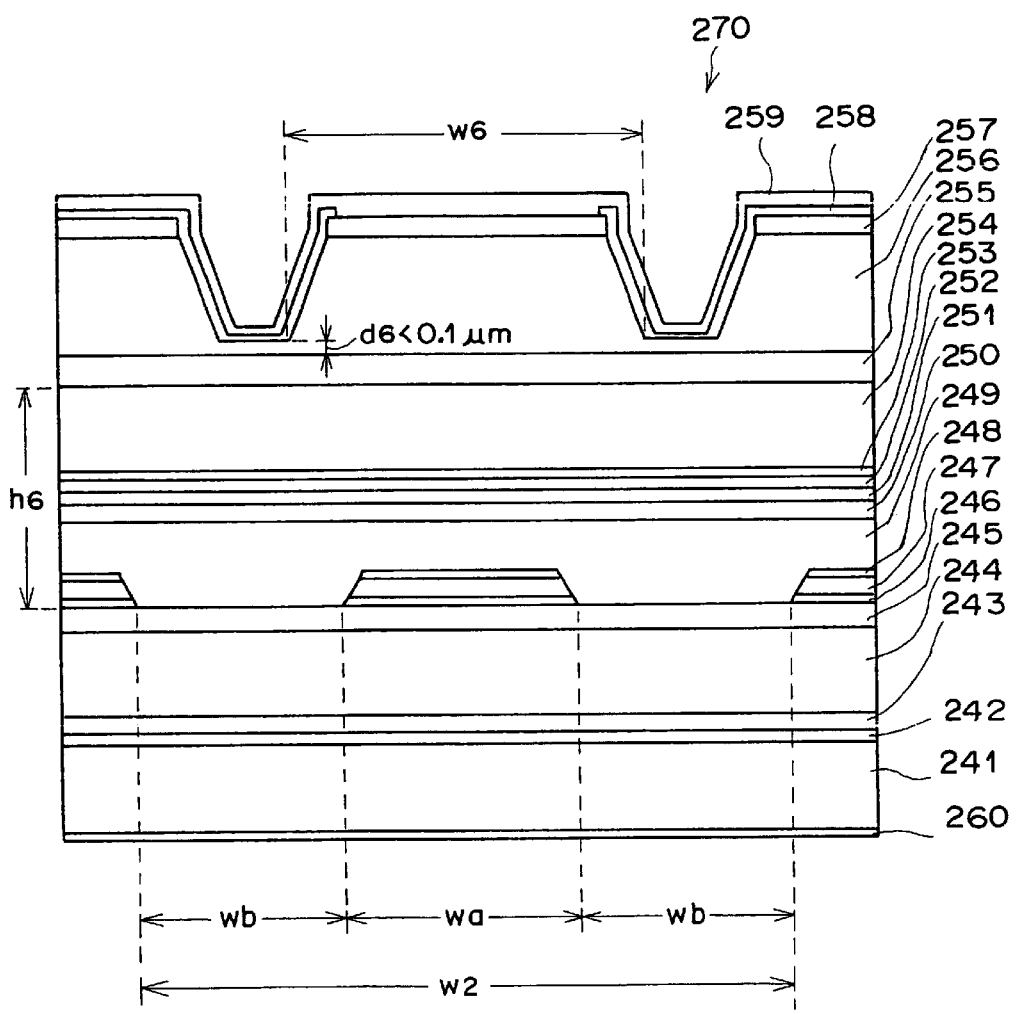
FIG. 11 is a schematic cross-sectional view showing a semiconductor laser element in accordance with a sixth embodiment of the present invention.

A semiconductor laser element in accordance with a sixth embodiment of the present invention will be described referring to a procedure of manufacturing the same with reference to FIG. 11.

The semiconductor laser element is manufactured by first and second vacuum MOCVD growth procedures. In first vacuum MOCVD growth procedure, an n-GaAs buffer layer 242 (doped with $5 \times 10^{17}/cm^3$ of Si, 0.5 μm in thickness), an n-$Al_xGa_{1-x}As$ graded buffer layer 243 (doped with $5 \times 10^{17}/$ cm$^3$ of Si, 0.2 μm in thickness and x standing for a value which gradually increases from 0.1 to 0.6), an n-Al$_{0.6}$Ga$_{0.4}$As clad layer 244 (doped with 5×10$^{17}$/cm$^3$ of Si, 1.5 μm in thickness), an SCH active layer 245, a p-GaAs layer 246 (doped with 8×10$^{17}$/cm$^3$ of Si, 4 nm in thickness), an n-(Al$_{0.9}$Ga$_{0.1}$)$_{0.52}$In$_{0.48}$P current-blocking layer 247 (doped with 1×10$^{18}$/cm$^3$ of Si, 0.8 μm in thickness) and an n-GaAs layer 248 (doped with 8×10$^{17}$/cm$^3$ of Si, 10 nm in thickness) are formed on an n-GaAs substrate 241 (doped with 2×10$^{18}$/cm$^3$ of Si) in this order.

Then a pair of stripe-like grooves each 30 μm in width wb as measured at the bottom thereof are formed at a space wa of 30 μm from each other in the an n-GaAs layer 248 by photolithography and chemical etching using a mixed solution of H$_2$SO$_4$, H$_2$O$_2$ and H$_2$O. Then the n-(Al$_{0.9}$Ga$_{0.1}$)$_{0.52}$In$_{0.48}$P current-blocking layer 247 is etched with HCl and the n-GaAs layer 246 is etched with mixed solution of H$_2$SO$_4$, H$_2$O$_2$ and H$_2$O.

Then over the layers thus formed, in second vacuum MOCVD growth procedure, a p-Al$_{0.6}$Ga$_{0.4}$As clad layer 249 (doped with 7$^x$10$^{17}$/cm$^3$ of Zn, 2 μm in thickness), a p$^+$-GaAs layer 250 (doped with 2$^x$10$^{19}$/cm$^3$ of Zn, 0.1 μm in thickness), an n$^+$-GaAs layer 251 (doped with 2$^x$10$^{19}$/cm$^3$ of Zn, 0.1 μm in thickness), an n$^+$-GaAs layer 251 (doped with 2$^x$10$^{18}$/cm$^3$ of Si, 0.1 μm in thickness), an n-GaAs buffer layer 252 (doped with 5$^x$10$^{17}$/cm$^3$ of Si, 0.5 μm in thickness), an n-Al$_x$Ga$_{1-x}$As graded buffer layer 253 (doped with 5$^x$10$^{17}$/cm$^3$ of Si, 0.2 μm in thickness and x standing for a value which gradually increases from 0.1 to 0.6), an n-Al$_{0.6}$Ga$_{0.4}$As clad layer 254 (doped with 5$^x$10$^{17}$/cm$^3$ of Si, 0.2 μm in thickness), an SCH active layer 255, a p-Al$_{0.6}$Ga$_{0.4}$As clad layer 256 (doped with 710$^{17}$/cm$^x$ of Zn, 2 μm in thickness) and a p-GaAs capping layer 257 (doped with 2$^x$10$^{19}$/cm$^3$ of Zn, 0.1 μm in thickness) are superposed.

Each of the SCH active layers 245 and 255 comprises an In$_{0.48}$Ga$_{0.52}$P optical waveguide layer (doped with 5×10$^{17}$/cm$^3$ of Si, 0.3 μm in thickness), an In$_{0.48}$Ga$_{0.52}$P optical waveguide layer (undoped, 0.1 μm in thickness), an In$_{0.13}$Ga$_{0.87}$As$_{0.75}$P$_{0.25}$ quantum-well layer (undoped, 10 nm in thickness), an In$_{0.48}$Ga$_{0.52}$P optical waveguide layer (undoped, 0.1 μm in thickness) and an In$_{0.48}$Ga$_{0.52}$P optical waveguide layer (doped with 7×10$^{17}$/cm$^3$ of Zn, 0.3 μm in thickness).

Then a pair of stripe-like grooves each 10 μm in width are formed by photolithography and chemical etching using a mixed solution of H$_2$SO$_4$:H$_2$O$_2$:H$_2$O=20:1:1, thereby forming between the groves a ridge stripe structure which is 40 μm in width w6 as measured at the base thereof. At this time, the p-Al$_{0.6}$Ga$_{0.4}$As clad layer 256 in the grooves is etched to a thickness (d6) not larger than 0.1 μm. The p-Al$_{0.6}$Ga$_{0.4}$As clad layer 256 in the grooves may be etched up to the SHG active layer 255 under the clad layer 256.

Then a SiO$_2$ insulating layer 258 is formed by plasma CVD, and the SiO$_2$ insulating layer 258 is removed from the upper surface of the mesa in the zones between 1 μm inward the opposite side edges of the mesa and 5 μm inward the opposite side edges of the mesa by etching using diluted HF and photolithography. Thereafter in the same manner as in the first embodiment, a p-side electrode (Ti/Pt/Ti/Pt/Au) 259 is formed, the bottom surface of the substrate 31 is ground, an n-side electrode (AuGe/Ni/Au) 260 is formed. From the wafer thus obtained, a laser bar is cut, the light exit end face is coated and a laser chip is cut in the same manner as in the first embodiment, whereby a laser chip 270 is obtained. Then the p-side electrode 259 is bonded to a copper block (heat sink) 272 with In solder (4 to 5 μm thick) as shown in FIG. 12.

Figure 12:
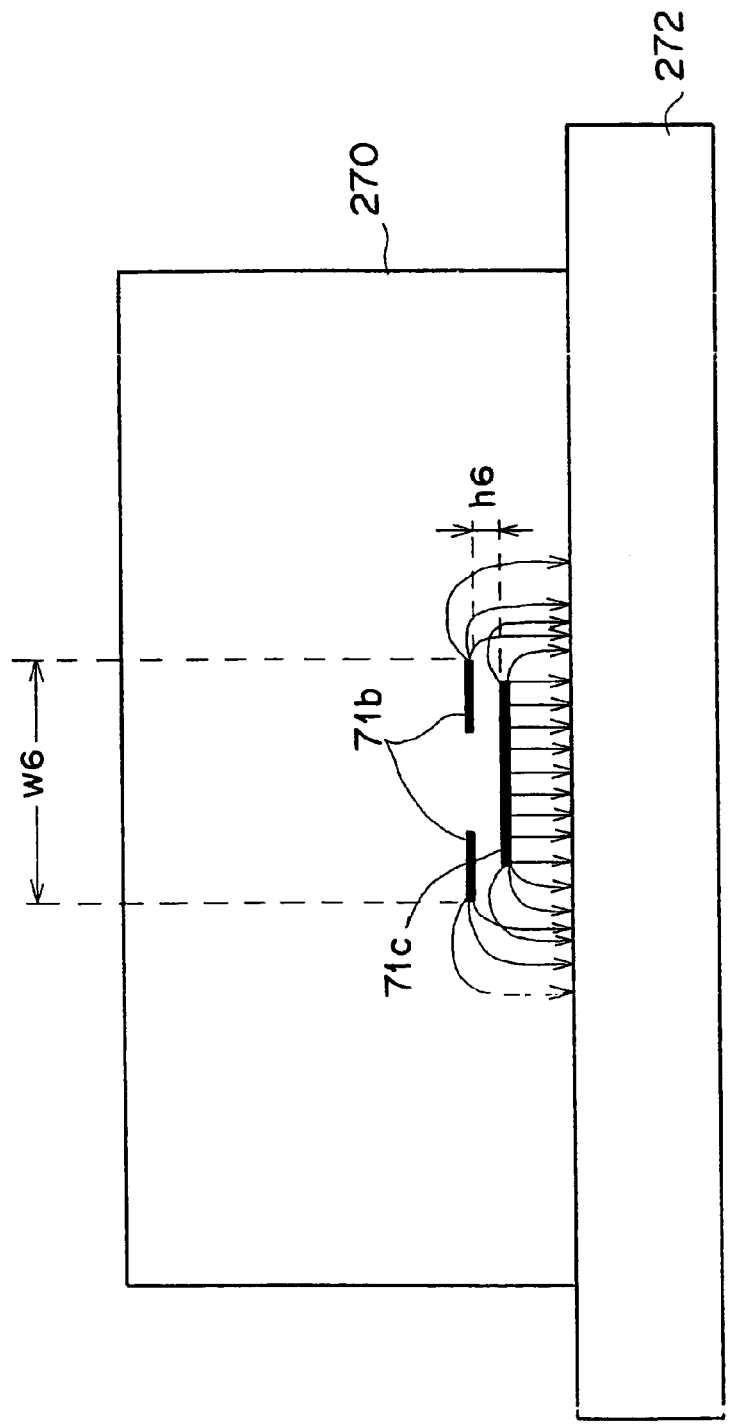
FIG. 12 is a schematic view for illustrating the heat flow from the active region in the semiconductor laser of the sixth embodiment.

Heat flow in the semiconductor laser element of this embodiment is schematically shown in FIG. 12. In FIG. 12, the laser chip 270 shown in FIG. 11 is shown upside down and only the active region 131 is shown as for the laser chip 130. The flow of heat generated in the active regions 271b and 271c is shown by arrows in FIG. 12. In this embodiment, so that heat dissipation through the heat sink 272 in contact with the p-side electrode 259 can be done effectively to both the active regions 271b and 271c, the active region 271b on the GaAs substrate side is divided into two parts and heat dissipation in the horizontal direction is better used. That is, as shown in FIG. 12, heat dissipation from the active region 271b remote from the heat sink 272 is done by effectively using horizontal spread of heat, thereby suppressing temperature elevation of the active region 271c near the heat sink 272.

A semiconductor laser element in accordance with a seventh embodiment of the present invention will be described referring to a procedure of manufacturing the same with reference to FIG. 13.

An n-GaAs buffer layer 302 (doped with 1×10$^{18}$/cm$^3$ of Si, 0.5 μm in thickness), an n-Al$_x$Ga$_{1-x}$As graded buffer layer 303 (doped with 5×10$^{17}$/cm$^3$ of Si, 0.2 μm in thickness and x standing for a value which gradually increases from 0.1 to 0.5), an n-Al$_{0.5}$Ga$_{0.5}$As clad layer 304 (doped with 5×10$^{17}$/cm$^3$ of Si, 1.5 μm in thickness), an SCH active layer 305, a p-Al$_{0.5}$Ga$_{0.5}$As clad layer 306 (doped with 7×10$^{17}$/cm$^3$ of Zn, 2 μm in thickness), a p$^+$-GaAs layer 307 (doped with 2×10$^{19}$/cm$^3$ of Zn, 0.1 μm in thickness), an n$^+$-GaAs layer 308 (doped with 2×10$^{18}$/cm$^3$ of Si, 0.1 μm in thickness), an n-GaAs buffer layer 309 (doped with 5×10$^{17}$/cm$^3$ of Si, 0.5 μm in thickness), an n-Al$_x$Ga$_{1-x}$As graded buffer layer 310 (doped with 5×10$^{17}$/cm$^3$ of Si, 0.2 μm in thickness and x standing for a value which gradually increases from 0.1 to 0.5), an n-Al$_{0.5}$Ga$_{0.5}$As clad layer 311 (doped with 5×10$^{17}$/cm$^3$ of Si, 2.0 μm in thickness), an SCI active layer 312, a p-Al$_{0.5}$Ga$_{0.5}$As clad layer 313 (doped with 7×10$^{17}$/cm$^3$ of Zn, 2 μm in thickness) and a p-GaAs capping layer 314 (doped with 2×10$^{19}$/cm$^3$ of Zn, 0.3 μm in thickness) are formed on an n-GaAs substrate 301 (doped with 2×10$^{18}$/cm$^3$ of Si) in this order by MOCVD growth. Each of the SCH active layers 305 and 312 comprises an Al$_{0.3}$Ga$_{0.7}$As optical waveguide layer (undoped, 0.3 μm in thickness), an Al$_{0.08}$Ga$_{0.92}$As quantum-well layer (undoped, 10 nm in thickness and an Al$_{0.3}$Ga$_{0.7}$As optical waveguide layer (undoped, 0.3 μm in thickness).

Then a SiN$_x$ film 0.2 μm thick is formed over a region corresponding to a stripe width of w7 (=40 μm) by plasma CVD, photolithography and etching. Further a SiO$_2$ film (0.5 μm thick) is formed over the entire area of the wafer by plasma CVD. Then Ga holes are purged by heat treatment from the p-GaAs capping layer except the stripe portion in contact with the SiO$_2$ film and the quantum-well is disordered by a fault dispersion portion 318, whereby a graded index optical waveguide structure is formed. The SiO$_2$ film is subsequently removed, and the p-GaAs capping layer except the stripe portion is removed by etching with a NH$_4$OH:H$_2$O$_2$ mixed etching solution. Further, the SiN$_x$ film is removed.

Then an SiN$_x$ film 0.2 μm thick is formed and a stripe-like window is formed on a portion corresponding to the stripe w7 by photolithography and etching. Thereafter in the same manner as in the first embodiment, a p-side electrode (Ti/Pt/Au) 316 is formed, the bottom surface of the substrate 301 is ground, an n-side electrode (AuGe/Ni/Au) 317 is formed. From the wafer thus obtained, a laser bar is cut, the light exit end face is coated and a laser chip is cut in the same manner as in the first embodiment, whereby a laser chip is obtained.

Figure 14:
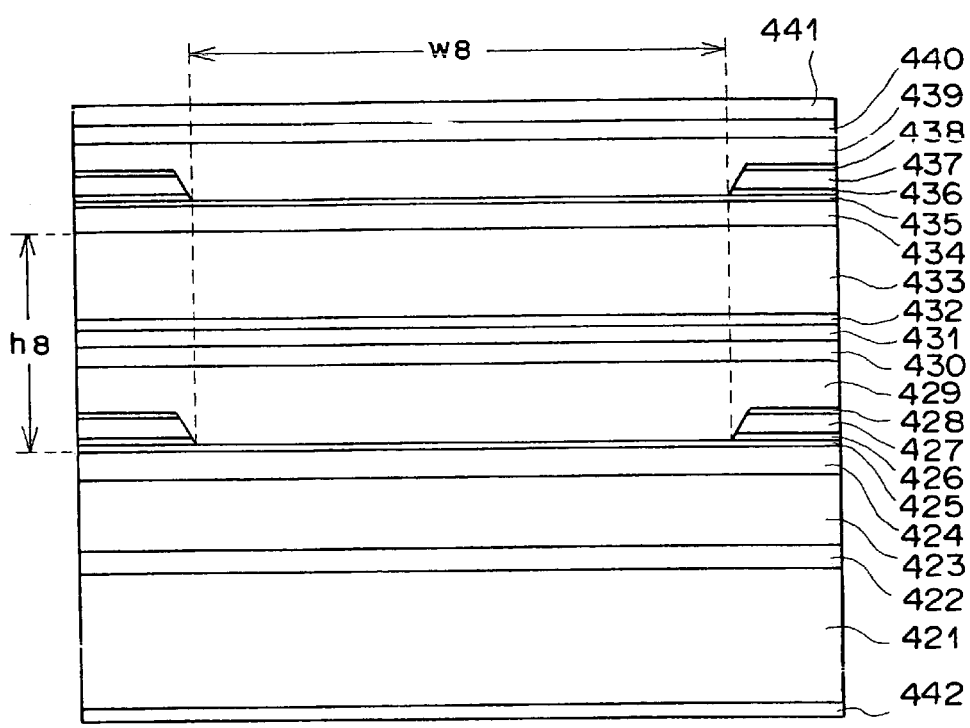
FIG. 14 is a schematic cross-sectional view showing a semiconductor laser element in accordance with an eighth embodiment of the present invention.

A semiconductor laser element in accordance with an eighth embodiment of the present invention will be described referring to a procedure of manufacturing the same with reference to FIG. 14.

The semiconductor laser element is manufactured by first to third MOCVD growth procedures. In first vacuum MOCVD growth procedure, an n-GaAs buffer layer 422 (doped with $1 \times 10^{18}/cm^3$ of Si, 0.5 μm in thickness), an n-$In_{0.48}Ga_{0.52}P$ clad layer 423 (doped with $1 \times 10^{18}/cm^3$ of Si, 1.5 μm in thickness), an SCH active layer 424, a p-$In_{0.48}Ga_{0.52}P$ clad layer 425 (doped with $1 \times 10^{18}/cm^3$ of Zn, 0.2 μm in thickness), an n-GaAs layer 426 (doped with $7 \times 10^{17}/cm^3$ of Si, 10 nm in thickness), an n-$In_{0.48}(Ga_{0.7}Al_{0.3})_{0.52}P$ current-blocking layer 427 (doped with $2 \times 10^{18}/cm^3$ of Si, 0.8 μm in thickness) and an n-GaAs layer 428 (doped with $7 \times 10^{17}/cm^3$ of Si, 10 nm in thickness) are formed on an n-GaAs substrate 421 (doped with $2 \times 10^{18}/cm^3$ of Si) in this order.

Then a stripe groove which is 20 μm in width w8 as measured at the bottom thereof is formed in the n-GaAs layer 428 by photolithography and chemical etching using a mixed solution of $H_2SO_4$, $H_2O_2$ and $H_2O$, then the n-$In_{0.48}(Ga_{0.7}Al_{0.3})_{0.52}P$ current-blocking layer 427 is etched with HCl, and the n-GaAs layer 426 is etched with a $H_2SO_4$, $H_2O_2$, $H_2O$ mixed solution.

Then over layers thus formed, in second vacuum MOCVD growth procedure, a $In_{0.48}Ga_{0.52}P$ clad layer 429 (doped with $1^x10^{18}/cm^3$ of Zn, 2 μm in thickness), a $p^+$-GaAs layer 430 (doped with $2^x10^{19}/cm^3$ of Zn, 0.1 μm in thickness), an $n^+$-GaAs buffer layer 432 (doped with $5^x10^{17}/cm^3$ of Si, 0.1 μm in thickness), an n-$In_{0.48}Ga_{0.52}P$ clad layer 433 (doped with $1^x10^{18}/cm^3$ of Si, 1.5 μm in thickness), an SCH active layer 434, a p-$In_{0.48}Ga_{0.52}P$ clad layer 435 (doped with $1^x10^{18}/cm^3$ of Zn, 0.2 μm in thickness), an n-GaAs layer 436 (doped with $7^x10^{17}/cm^3$ of Si, 10 nm in thickness), an n-$In_{0.48}(Ga_{0.7}Al_{0.3})_{0.52}P$ current-blocking layer 437 (doped with $2^x10^{18}/cm^3$ of Si, 0.8 μm in thickness) and an n-GaAs layer 438 (doped with $7^x10^{17}/cm^3$ of Si, 10 nm in thickness) are formed.

Then a stripe groove which is 20 μm in width w8 as measured at the bottom thereof is formed in the n-GaAs layer 438 by photolithography and chemical etching using a mixed solution of $H_2SO_4$, $H_2O_2$ and $H_2O$, then the n-$In_{0.48}(Ga_{0.7}Al_{0.3})_{0.52}P$ current-blocking layer 437 is etched with HCl, and the n-GaAs layer 436 is etched with a $H_2SO_4$, $H_2O_2$, $H_2O$ mixed solution.

Then in third MOCVD growth, a p-$In_{0.48}Ga_{0.52}P$ clad layer 439 (doped with $1 \times 10^{18}/cm^3$ of Zn, 1.8 μm in thickness) and a p-GaAs capping layer 440 (doped with $2 \times 10^{19}/cm^3$ of Zn, 0.3 μm in thickness) are formed.

Each of the SCH active layers 424 and 434 comprises an $In_{0.1}Ga_{0.9}As_{0.8}P_{0.2}$ optical waveguide layer (undoped, 0.08 μm in thickness), a $GaAs_{0.8}P_{0.2}$ tensile-strained barrier layer (undoped, 10 nm in thickness), an $In_{0.28}Ga_{0.72}As$ compressive-strained quantum-well layer (undoped, 7 nm in thickness), a $GaAs_{0.8}P_{0.2}$ tensile-strained barrier layer (undoped, 10 nm in thickness) and an $In_{0.1}Ga_{0.9}As_{0.8}P_{0.2}$ optical waveguide layer (undoped, 0.08 μm in thickness).

Thereafter in the same manner as in the first embodiment, a p-side electrode (Ti/Pt/Au) 441 is formed, the bottom surface of the substrate 421 is ground, an n-side electrode (AuGe/Ni/Au) 442 is formed. From the wafer thus obtained, a laser bar is cut, the light exit end face is coated and a laser chip is cut in the same manner as in the first embodiment, whereby a laser chip is obtained.

Figure 15:
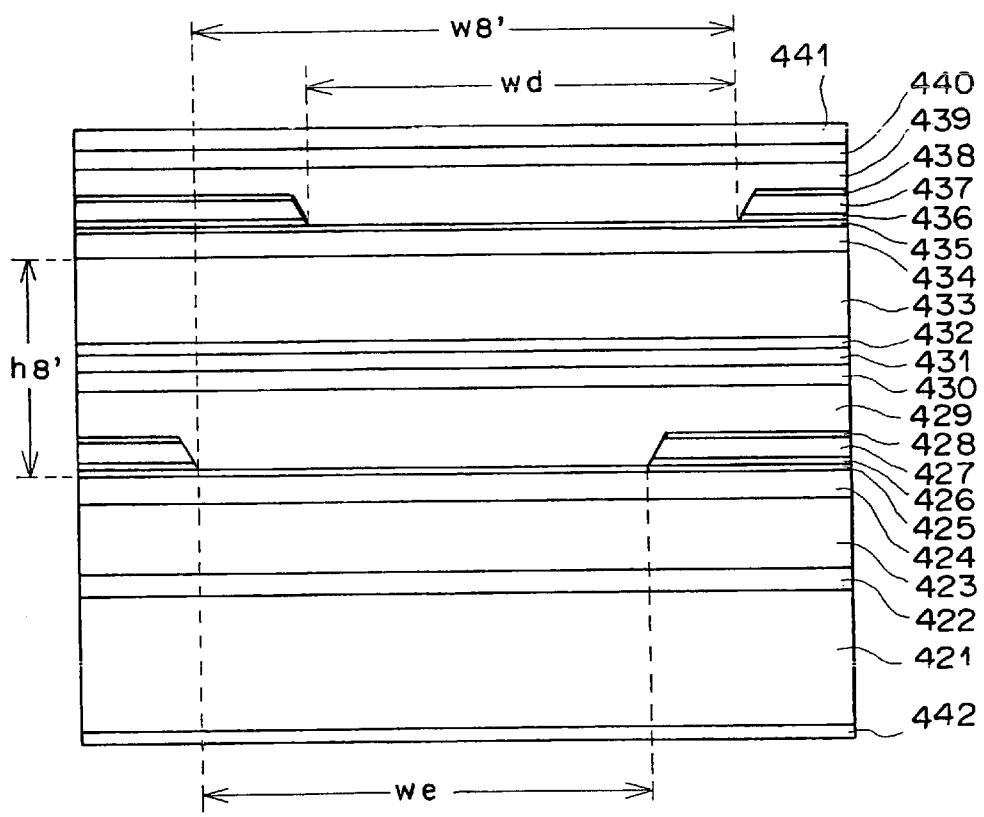
FIG. 15 is a schematic cross-sectional view showing a modification of the semiconductor laser element in accordance with the eighth embodiment of the present invention.

The active regions need not be in the same position in the direction of width of the laser element. That is, the stripe formed by the upper current blocking and the stripe formed by the lower current blocking may be in different positions in the direction of width of the laser element as shown in FIG. 15. FIG. 15 shows a modification of the laser element of the eighth embodiment. In FIG. 15 the elements analogous to those shown in FIG. 14 are given the same reference numerals. The stripe formed by the upper current blocking and the stripe formed by the lower current blocking are wd and we in width, respectively. The virtual width w8' of the active region is the distance in the direction of width of the laser element between the edges of the active regions which are most distant from each other. The distance h8' between the active layers is to be set smaller than the virtual width w8' of the active region, which should be not larger than 100 μm.

Figure 16:
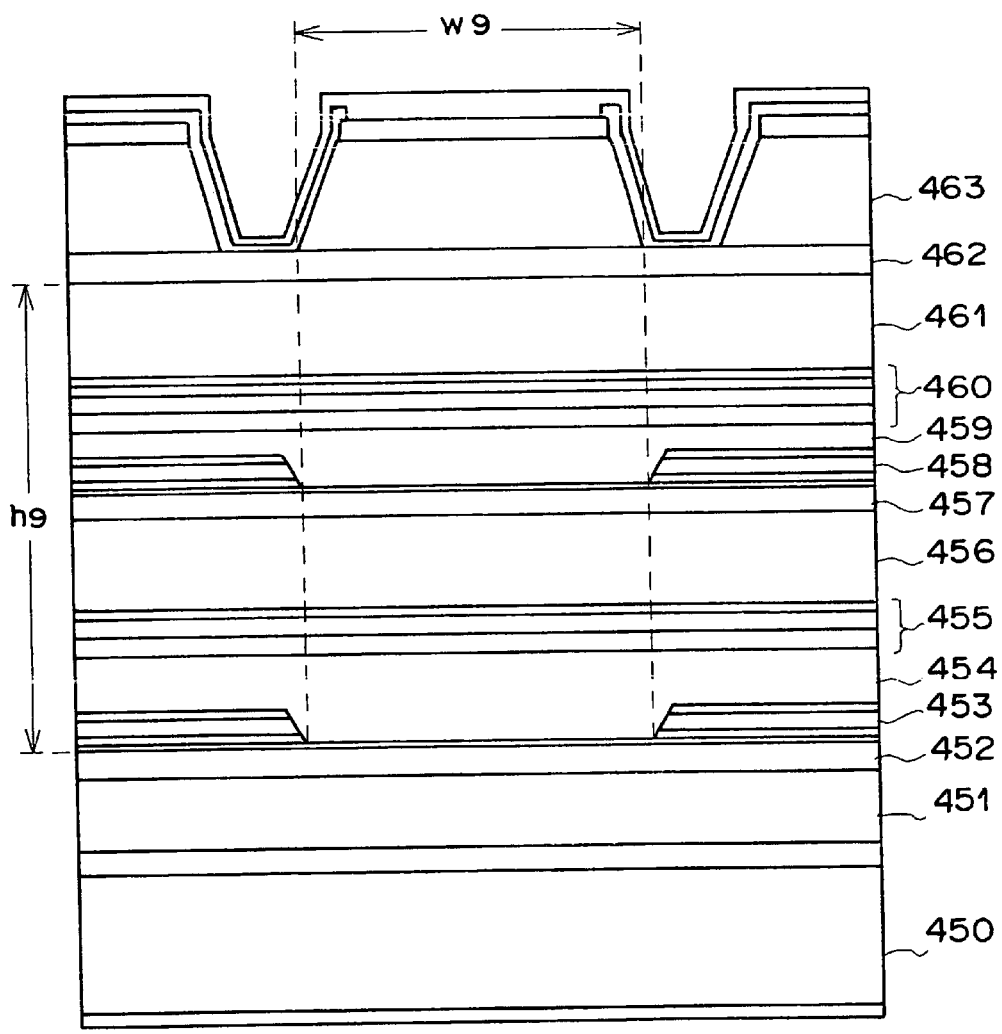
FIG. 16 is a schematic cross-sectional view showing a semiconductor laser element in accordance with a ninth embodiment of the present invention.

FIG. 16 shows the layer structure of a semiconductor laser element in accordance with a ninth embodiment of the present invention. The semiconductor laser element of the ninth embodiment is substantially the same as that of the eighth embodiment shown in FIG. 14 except that the ninth embodiment has three active regions.

The semiconductor laser element of this embodiment comprises three laser structures respectively comprising an active layer 452 interposed between an n-type clad layer 451 and a p-type clad layer 454, an active layer 457 interposed between an n-type clad layer 456 and a p-type clad layer 459, and an active layer 462 interposed between an n-type clad layer 461 and a p-type clad layer 463. A $p^+n^+$-junctions 455 and 460 intervene between the lower and middle laser structures and between the middle and upper laser structures. The active region widths w9 of the lower and middle laser structures are limited by current blocking layers 453 and 458 and the active region width w9 of the uppermost laser structure is limited by a ridge structure 463.

When the semiconductor laser elements in accordance with the seventh to ninth embodiments of the present invention are provided with heat sinks both on the substrate side and on the growth layer side, the heat dissipation effect can be further improved and reliability at high output power can be improved.

The stripe widths of the semiconductor laser elements w7 to w9 are in the range of 10 to 100 μm, and the distance h (h7, h8, h9) between the active layers in each semiconductor laser element is smaller than the stripe width. Preferably the thickness of the laser element is not larger than 100 μm and more preferably not larger than 80 μm. The width of each laser element is about 500 μm and is not smaller than W+2h.

Further, though the laser elements in accordance with the fifth to ninth embodiments described above have two or three superposed active regions, four or more active regions may be superposed with a $P^+N^+$-tunnel junction intervening between each pair of the laser structures. Further, each active region may be of a multiquantum-well structure comprising a plurality of quantum-wells. Further, the second aspect of the present invention may be applied to various semiconductor lasers such as InGaAlP 600 nm-band lasers, 1.3 to 1.6 μm-band lasers with an InP substrate, InGaN lasers and the like.

A semiconductor laser element in accordance with a tenth embodiment of the present invention will be described referring to a procedure of manufacturing the same with reference to FIG. 17.

Figure 17:
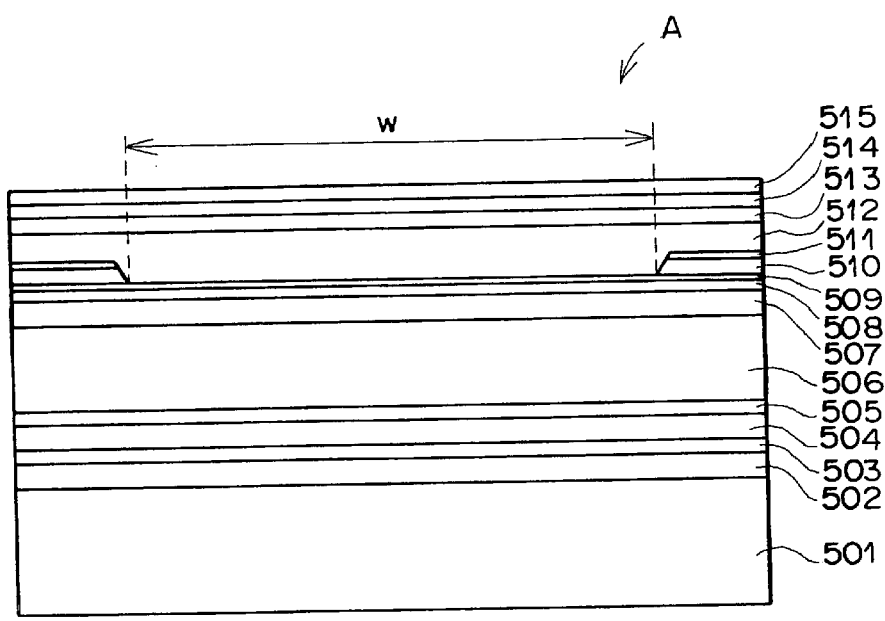
FIG. 17 is a schematic cross-sectional view showing a first wafer of a semiconductor laser element in accordance with a tenth embodiment of the present invention.

A wafer A shown in FIG. 17 is first formed. In first vacuum MOCVD growth procedure, an n-GaAs buffer layer 502 (doped with $5 \times 10^{17}/cm^3$ of Si, 0.2 μm in thickness), an n-$In_{0.48}Ga_{0.52}P$ etching stop layer 503 (doped with $5 \times 10^{17}/$ cm$^3$ of Si, 10 nm in thickness), an n-GaAs buffer layer 504 (doped with 5×10$^{17}$/cm$^3$ of Si, 0.5 µm in thickness), an n-Al$_x$Ga$_{1-x}$As graded buffer layer 505 (doped with 5×10$^{17}$/cm$^3$ of Si, 0.2 µm in thickness and x standing for a value which gradually increases from 0.1 to 0.63), an n-Al$_{0.63}$Ga$_{0.37}$As clad layer 506 (doped with 5×10$^{17}$/cm$^3$ of Si, 1.5 µm in thickness), an SCH active layer 507, a p-Al$_{0.63}$Ga$_{0.37}$As clad layer 508 (doped with 5×10$^{17}$/cm$^3$ of Si, 0.2 µm in thickness), a p-GaAs layer 509 (doped with 7×10$^{17}$/cm$^3$ of Zn, 4 nm in thickness), an n-In$_{0.48}$(Ga$_{0.1}$Al$_{0.9}$)$_{0.52}$P current-blocking layer 510 (doped with 8×10$^{17}$/cm$^3$ of Si, 0.8 µm in thickness) and an n-GaAs layer 511 (doped with 8×10$^{17}$/cm$^3$ of Si, 10 nm in thickness) are formed on an n-GaAs substrate 501 (doped with 2×10$^{18}$/cm$^3$ of Si) in this order.

Then a stripe groove which is 80 µm in width w as measured at the bottom thereof is formed in the n-GaAs layer 511 by photolithography and chemical etching using a mixed solution of H$_2$SO$_4$, H$_2$O$_2$ and H$_2$O, and the n-In$_{0.48}$(Ga$_{0.1}$Al$_{0.9}$)$_{0.52}$P current-blocking layer 510 is removed by etching with HCl.

Then over the layers thus formed, in second vacuum MOCVD growth procedure, a p-Al$_{0.63}$Ga$_{0.37}$As clad layer 512 (doped with 7×10$^{17}$/cm$^3$ of Zn, 2 µm in thickness), a p$^+$-GaAs layer 513 (doped with 2×10$^{19}$/cm$^3$ of Zn, 0.1 µm in thickness), an n$^+$-GaAs layer 514 (doped with 2×10$^{18}$/cm$^3$ of Si, 0.1 µm in thickness), an n-GaAs buffer layer 515 (doped with 5×10$^{17}$/cm$^3$ of Si, 0.5 µm in thickness) are formed in this order, thereby obtaining an epitaxial wafer A.

Figure 18:
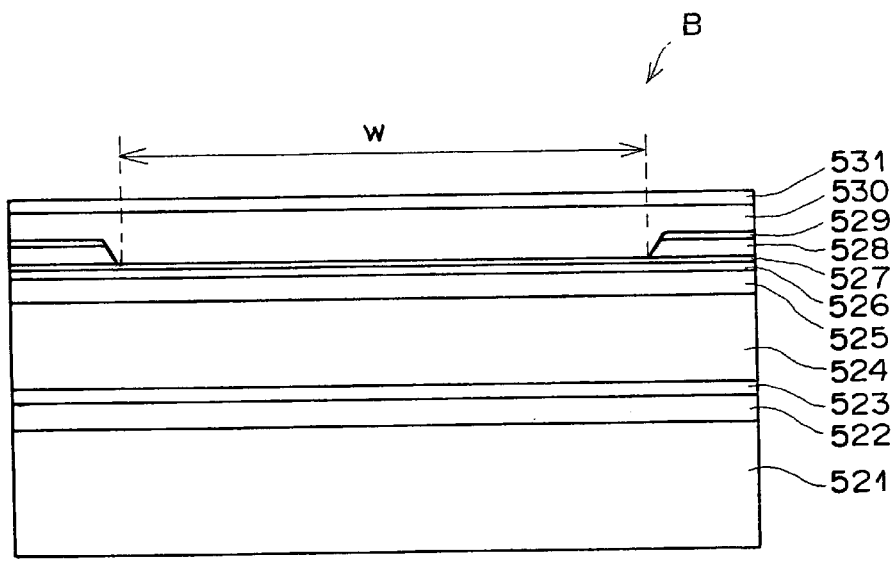
FIG. 18 is a schematic cross-sectional view showing a second wafer of the semiconductor laser element in accordance with the tenth embodiment of the present invention.

Then a wafer B shown in FIG. 18 is formed. In first vacuum MOCVD growth procedure, an n-GaAs buffer layer 522 (doped with 5×10$^{17}$/cm$^3$ of Si, 0.5 µm in thickness), an n-Al$_x$Ga$_{1-x}$As graded buffer layer 523 (doped with 5×10$^{17}$/cm$^3$ of Si, 0.2 µm in thickness and x standing for a value which gradually increases from 0.1 to 0.63), an n-Al$_{0.63}$Ga$_{0.37}$As clad layer 524 (doped with 5×10$^{17}$/cm$^3$ of Si, 1.5 µm in thickness), an SCH active layer 525, a p-Al$_{0.63}$Ga$_{0.37}$As clad layer 526 (doped with 5×10$^{17}$/cm$^3$ of Si, 0.2 µm in thickness), a p-GaAs layer 527 (doped with 7×10$^{17}$/cm$^3$ of Zn, 4 nm in thickness), an n-In$_{0.48}$(Ga$_{0.1}$Al$_{0.9}$)$_{0.52}$P current-blocking layer 528 (doped with 8×10$^{17}$/cm$^3$ of Si, 0.8 µm in thickness) and an n-GaAs layer 529 (doped with 8×10$^{17}$/cm$^3$ of Si, 10 nm in thickness) are formed on an n-GaAs substrate 521 (doped with 2×10$^{18}$/cm$^3$ of Si) in this order.

Then a stripe groove which is 80 µm in width w as measured at the bottom thereof is formed in the n-GaAs layer 529 by photolithography and chemical etching using a mixed solution of H$_2$SO$_4$, H$_2$O$_2$ and H$_2$O, and the n-In$_{0.48}$(Ga$_{0.1}$Al$_{0.9}$)$_{0.52}$P current-blocking layer 528 is removed by etching with HCl.

Then over the layers thus formed, in second vacuum MOCVD growth procedure, a p-Al$_{0.63}$Ga$_{0.37}$As clad layer 530 (doped with 7×10$^{17}$/cm$^3$ of Zn, 2 µm in thickness) and a p-GaAs capping layer 531 (doped with 2×10$^{19}$/cm$^3$ of Zn, 0.1 µm in thickness) are formed in this order.

Each of the SCH active layers 507 and 525 of the wafers A and B comprises an In$_{0.48}$Ga$_{0.52}$P optical waveguide layer (doped with 5×10$^{17}$/cm$^3$ of Si, 0.3 µm in thickness), an In$_{0.48}$Ga$_{0.52}$P optical waveguide layer (undoped, 0.1 µm in thickness), an Al$_{0.13}$Ga$_{0.87}$As$_{0.75}$P$_{0.25}$ quantum-well layer (undoped, 10 nm in thickness), an In$_{0.48}$Ga$_{0.52}$P optical waveguide layer (undoped, 0.1 µm in thickness) and an In$_{0.48}$Ga$_{0.52}$P optical waveguide layer (doped with 7×10$^{17}$/cm$^3$ of Zn, 0.3 µm in thickness).

The n-GaAs substrate 521 of the wafer B is ground to a thickness of 60 µm, and then mirror-polished. Then the surface of the n-GaAs substrate 521 is slightly etched (cleaned) with a mixed solution of H$_2$SO$_4$, H$_2$O$_2$ and H$_2$O, and then finally washed with super pure water and dried. Also the wafer A is washed with super pure water and dried.

Thereafter, the surface of the growth layers of the wafer A is brought into contact with the mirror-polished surface of the substrate 521 of the wafer B with the directions and positions of the stripes of the wafers A and B aligned with each other, and a weight of about 300 g/cm$^2$ is placed on the wafer assembly. In this state, the wafer assembly is heat-treated at 700° C. for one hour in hydrogen. In this manner, the wafers A and B are bonded together as shown in FIG. 19.

Then the n-GaAs substrate 501 and the n-GaAs buffer layer 502 of the wafer A are removed by chemical etching using a mixed solution of H$_2$SO$_4$, H$_2$O$_2$ and H$_2$O, and the n-In$_{0.48}$Ga$_{0.52}$P current-blocking layer 503 is removed by etching with HCl, whereby the wafer A is modified to a wafer A' and a laser wafer is obtained.

Figure 20:
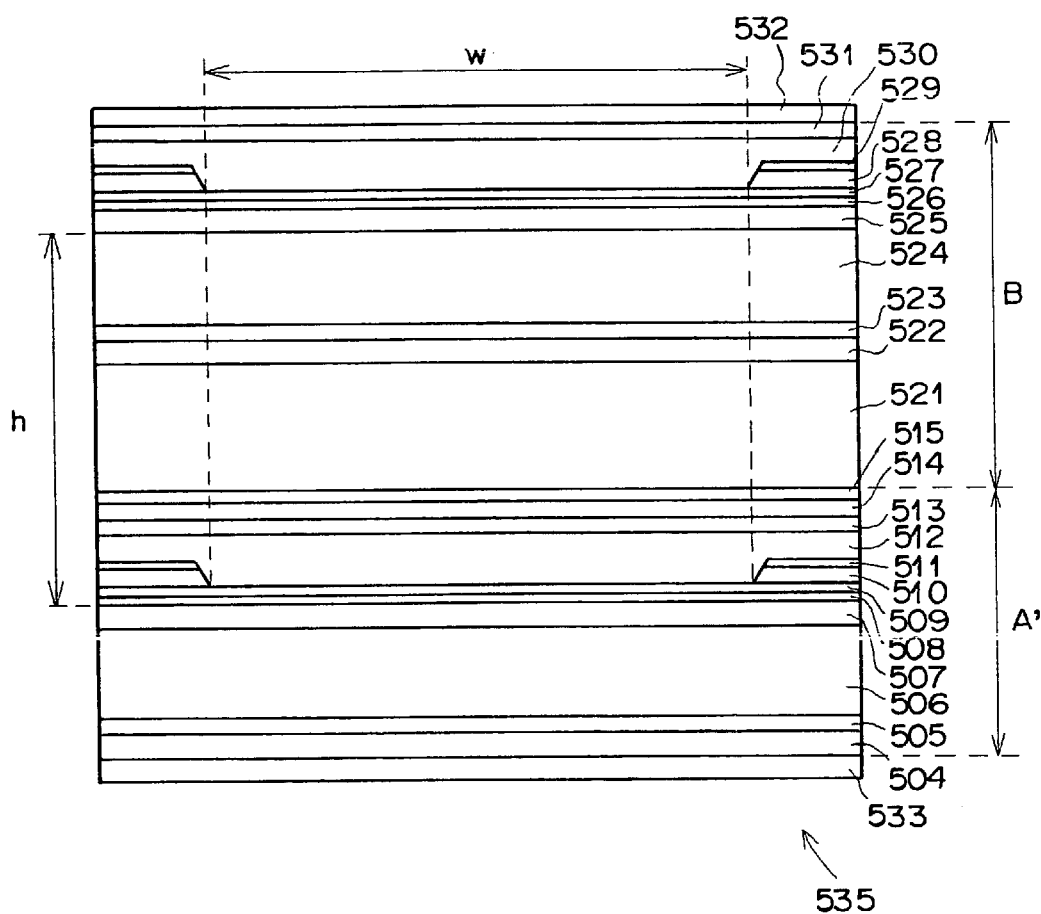
FIG. 20 is a schematic cross-sectional view showing the semiconductor laser element in accordance with the tenth embodiment of the present invention.

Thereafter a p-side electrode (Ti/Pt/Ti/Pt/Au) 532 is formed on the p-GaAs capping layer 531 by vapor deposition and heat-treatment as shown in FIG. 20, and an n-side electrode (AuGe/Ni/Au) 533 is formed on the n-GaAs buffer layer 504 by vapor deposition and heat-treatment. From the laser wafer thus obtained, a laser bar about 1 cm in length and 1.5 mm in resonator length is cut by scribing and cleavage with a diamond needle. Then the light exit end face is coated with an optical film which is 8% in reflectivity and the rear face is coated with an optical film which is not lower than 95% in reflectivity. Further, from the laser bar, a laser chip 535 about 500 µm in width is cut by scribing and cleavage with a diamond needle. Then the n-side electrode 533 is bonded to a small copper heat sink 537 with In solder (4 to 5 µm thick) and the p-side electrode 532 is bonded to a small copper heat sink 538 with In solder (4 to 5 µm thick) as shown in FIG. 21.

Figure 21:
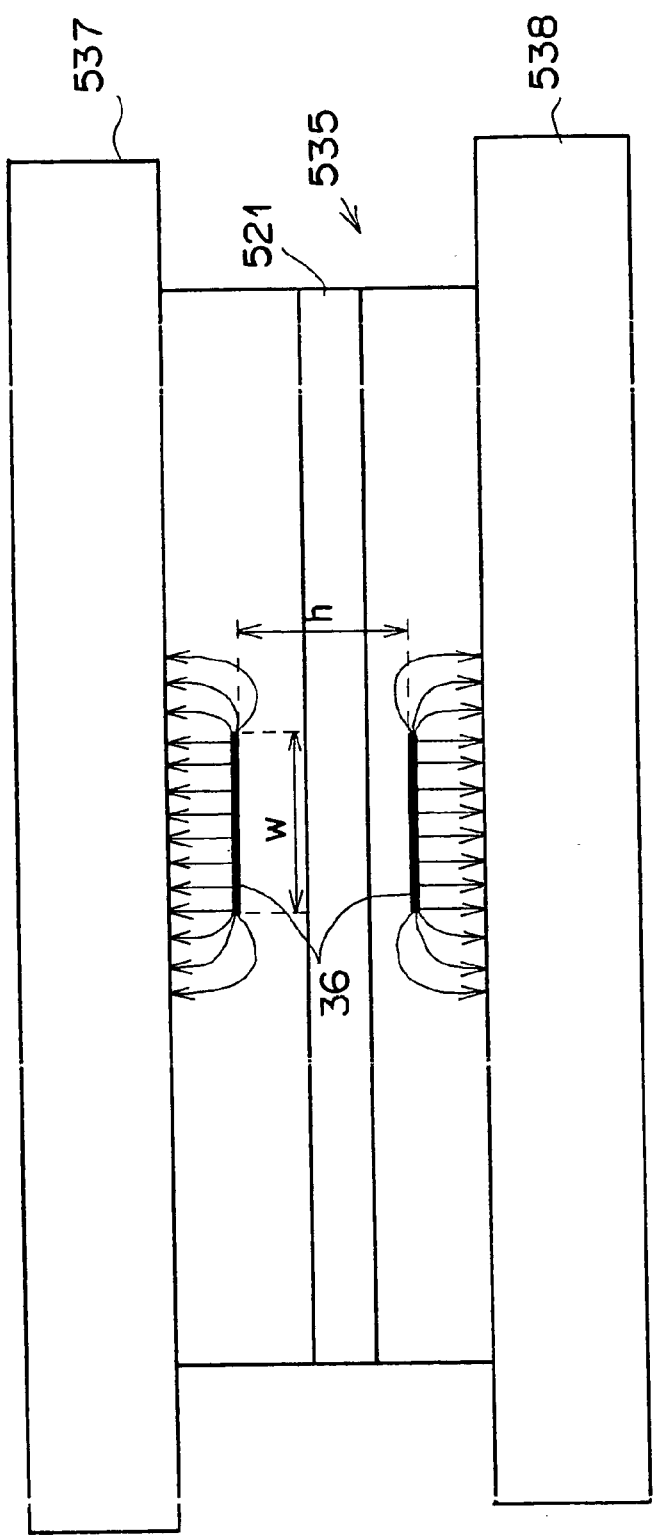
FIG. 21 is a schematic view for illustrating the heat flow from the active region in the semiconductor laser of the tenth embodiment.

Heat flow in the semiconductor laser element of this embodiment is schematically shown in FIG. 21. In FIG. 21, only the active region 536 is shown as for the laser chip 535. The flow of heat generated in the active region 536 is shown by arrows in FIG. 21. By largely separating a plurality of active layers 507 and 525 by use a thickness of the substrate 521, heat can be effectively dissipated from the upper and lower active regions 536 and reliability during high power operation is improved. Further when the distance h between the active layers 507 and 525 is smaller than the maximum stripe width, the virtual light emitting region cannot exceed the stripe width and accordingly, the wide stripe multiple transverse mode high-output semiconductor laser apparatus practically arises no problem.

The semiconductor laser apparatus of this embodiment manufactured in the manner described above oscillates at about 809 nm with a threshold current of about 150 mA and can continuously operates at high output power not lower than 5 w at room temperature without a kink in the optical output versus current characteristics.

Figure 22:
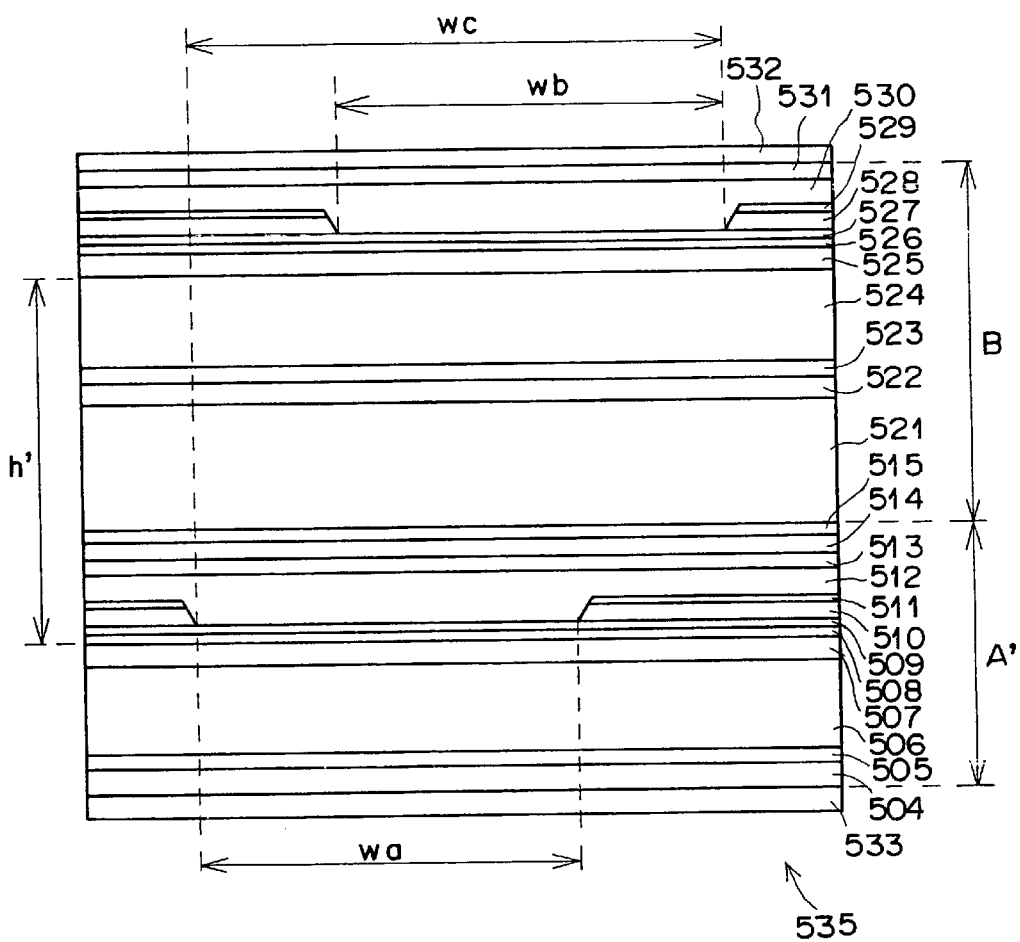
FIG. 22 is a schematic cross-sectional view showing a modification of the semiconductor laser element in accordance with the tenth embodiment of the present invention.

Though, in the tenth embodiment, the wafers A and B are bonded with the positions of the stripes of the wafers A and B aligned with each other, the stripes of the wafers A and B may be offset in the direction of width as shown in FIG. 22. The widths of the stripes are wa and wb, respectively. The virtual width of the active region is the distance wc in the direction of width of the laser element between the edges of the active regions which are most distant from each other. The distance h' between the active layers 507 and 525 is to be set smaller than the virtual width wc of the active region.

Figure 23:
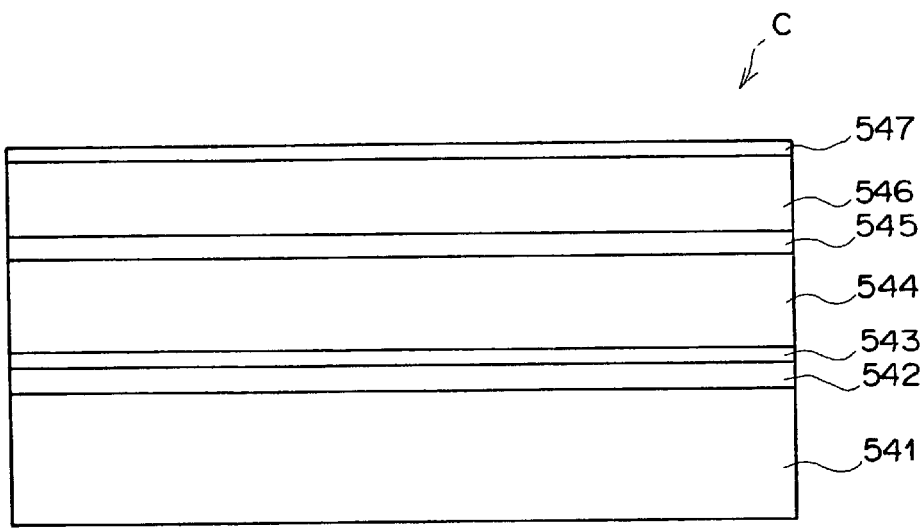
FIG. 23 is a schematic cross-sectional view showing a second wafer of a semiconductor laser element in accordance with a eleventh embodiment of the present invention.

A semiconductor laser apparatus in accordance with a eleventh embodiment of the present invention will be described referring to a procedure of manufacturing the same with reference to FIGS. 23 and 24.

Wafers A and C are employed in this embodiment. The wafer A is the same as that employed in the tenth embodiment. The wafer C is as shown in FIG. 23 and comprises an n-GaAs buffer layer 542 (doped with $5 \times 10^{17}/cm^3$ of Si, 0.5 µm in thickness), an n-$Al_xGa_{1-x}As$ graded buffer layer 543 (doped with $5 \times 10^{17}/cm^3$ of Si, 0.2 µm in thickness and x standing for a value which gradually increases from 0.1 to 0.63), an n-$Al_{0.63}Ga_{0.37}As$ clad layer 544 (doped with $5 \times 10^{17}/cm^3$ of Si, 1.5 µm in thickness), an SCH active layer 545, a p-$Al_{0.63}Ga_{0.37}As$ clad layer 546 (doped with $5 \times 10^{17}/cm^3$ of Si, 0.2 µm in thickness), and a p-GaAs capping layer 547 (doped with $2 \times 10^{19}/cm^3$ of Zn, 0.1 µm in thickness) formed on an n-GaAs substrate 541 (doped with $2 \times 10^{18}/cm^3$ of Si) in this order. The SCH active layers 545 comprises an $In_{0.48}Ga_{0.52}P$ optical waveguide layer (doped with $5 \times 10^{17}/cm^3$ of Si, 0.3 µm in thickness), an $In_{0.48}Ga_{0.52}P$ optical waveguide layer (undoped, 0.1 µm in thickness), an $In_{0.13}Ga_{0.87}As_{0.75}P_{0.25}$ quantum-well layer (undoped, 10 nm in thickness), an $In_{0.48}Ga_{0.52}P$ optical waveguide layer (undoped, 0.1 µm in thickness) and a p-$In_{0.48}Ga_{0.52}P$ optical waveguide layer (doped with $7 \times 10^{17}/cm^3$ of Zn, 0.3 µm in thickness).

The n-GaAs substrate 541 of the wafer C is ground to a thickness of 50 µm, and then mirror-polished. Then the surface of the n-GaAs substrate 541 is slightly etched (cleaned) with a mixed solution of $H_2SO_4$, $H_2O_2$ and $H_2O$, and then finally washed with super pure water and dried. Also the wafer A is washed with super pure water and dried.

Thereafter, the surface of the growth layers of the wafer A is brought into close contact with the mirror-polished surface of the substrate 541 of the wafer C, and a weight of about 300 g/cm² is placed on the wafer assembly. In this state, the wafer assembly is heat-treated at 700° C. for one hour in hydrogen. In this manner, the wafers A and C are bonded together as shown in FIG. 19.

Then the n-GaAs substrate 501 and the n-GaAs buffer layer 502 of the wafer A are removed by chemical etching using a mixed solution of $H_2SO_4$, $H_2O_2$ and $H_2O$, and the n-$In_{0.48}Ga_{0.52}P$ current-blocking layer 503 is removed by etching with HCl, whereby the wafer A is modified to a wafer A' and a laser wafer is obtained.

Then a pair of stripe-like grooves each 10 µm in width are formed by photolithography and chemical etching using a mixed solution of $H_2SO_4:H_2O_2:H_2O=20:1:1$, thereby forming between the grooves a ridge stripe structure which is 80 µm in width w as measured at the base thereof. At this time, the p-$Al_{0.63}Ga_{0.37}As$ clad layer 546 in the grooves is etched to a thickness not larger than 0.1 µm. The p-$Al_{0.63}Ga_{0.37}As$ clad layer 546 in the grooves may be etched up to the SHG active layer 545 under the clad layer 546. Then a $SiO_2$ insulating layer 548 is formed by plasma CVD, and the $SiO_2$ insulating layer 548 is removed from the upper surface of the mesa in the zones between 1 µm inward the opposite side edges of the mesa and 5 µm inward the opposite side edges of the mesa by etching using diluted HF and photolithography.

Thereafter a p-side electrode (Ti/Pt/Ti/Pt/Au) 549 is formed on the p-GaAs capping layer 547 by vapor deposition and heat-treatment as shown in FIG. 20, and an n-side electrode (AuGe/Ni/Au) 550 is formed on the n-GaAs buffer layer 504 by vapor deposition and heat-treatment. From the wafer thus obtained, a laser bar is cut, the light exit end face is coated and a laser chip is cut in the same manner as in the first embodiment, whereby a laser chip is obtained. The upper and lower surfaces of the laser chip 555 are bonded to copper heat sinks by In solder.

Though the laser elements in accordance with the tenth and eleventh embodiments described above have only two superposed active regions, three or more active regions may be superposed with a $P^+N^+$-tunnel junction intervening between each pair of the laser structures. Further, each active region may be of a multiquantum-well structure comprising a plurality of quantum-wells. Further, the third and fourth aspects of the present invention may be applied to various semiconductor lasers oscillating at other wavelengths such as those with a GaAs substrate (e.g., InGaAlP lasers, InGaAs lasers, InGaAsN lasers of 0.6 to 1.3 µm-band), such as those with an InP substrate (lasers of 1.3 to 1.6 µm-band), InGaN lasers with a substrate of SiC, and the like.

What is claimed is:

1. A high-output semiconductor laser element comprising:
   a plurality of laser structures having a number of semiconductor layers, each of said laser structures comprising at least one active layer interposed between a P-type clad layer and a N-type clad layer, which are superposed one on another on a substrate; and
   a first P-type clad layer of a first laser device and a first N-type clad layer of a second laser device forming a $P^+N^+$-tunnel junction thereinbetween, said tunnel junction interposed between each pair of the laser structures,
   wherein the active region of each of the laser structures is not smaller than 10 µm and not larger than 80 µm in width,
   the distance h between the active layers which are most distant from each other in the active layers of the laser structures is not larger than the width W of the active region which is the widest in the laser structures, and
   the width of said semiconductor laser element is not smaller than W+2h.

2. A high-output semiconductor laser element as defined in claim 1 in which heat sinks are provided on both the laser structure side and the substrate side.

3. A high output semiconductor laser element as defined in claim 1 which is not larger than 100 µm in thickness.

4. A high-output semiconductor laser element comprising:
   a plurality of laser structures having a number of semiconductor layers, each of said laser structures comprising at least one active layer interposed between a P-type clad layer and a N-type clad layer, which are superposed one on another on a substrate; and
   a first P-type clad layer of a first laser device and a first N-type clad layer of a second laser device forming a $P^+N^+$-tunnel junction thereinbetween, said tunnel junction interposed between each pair of the laser structures,
   wherein the active region of each of the laser structures is not smaller than 10 µm and not larger than 100 µm in width,
   the distance h between the active layers which are most distant from each other in the active layers of the laser structures is not larger than the virtual width W of the active region of the laser element formed by the active regions of the laser structures,
   the width of said semiconductor laser element is not smaller than W+2h, and
   each of the laser structures is provided with at least one of a current-blocking structure and a graded index optical waveguide structure.

5. A high-output semiconductor laser element as defined in claim 4 in which the active regions of the laser structures are in different positions in the direction of width of the laser element within a range of not larger than 100 μm.

6. A high-output semiconductor laser element as defined in claim 4 in which the laser structure which is most distant from the substrate in the laser structures is of a ridge optical waveguide type.

7. A high-output semiconductor laser element as defined in claim 4 in which the laser structures except the laser structure which is most distant from the substrate in the laser structures have a plurality of stripe-like active regions.

8. A high-output semiconductor laser element as defined in claim 4 in which heat sinks are provided on both the laser structure side and the substrate side.

9. A high-output semiconductor laser element as defined in claim 8 which is not larger than 100 μm in thickness.

10. A high-output semiconductor laser apparatus comprising:

a semiconductor laser element including a plurality of laser structures which are superposed one on another with a $P^+N^+$-tunnel junction disposed between each pair of the laser structures, each of the laser structures comprising at least one active layer interposed between a P-type clad layer and a N-type clad layer and at least two of the laser structures being spaced from each other by a substrate and a first P-type clad layer of a first laser device and a first N-type clad layer of a second laser device forming the $P^+N^+$-tunnel junction thereinbetween; and a pair of heat sinks which are respectively provided on the upper and lower surface of the semiconductor laser element, wherein the active region of each of the laser structures is not smaller than 30 μm and not larger than 500 μm in width, and the distance between the active layers which are most distant from each other in the active layers of the laser structures is not larger than the virtual width of the active region of the laser element formed by the active regions of the laser structures.

11. A high-output semiconductor laser apparatus as defined in claim 10 in which each of the laser structures is provided with at least one of a current-blocking structure and a graded index optical waveguide structure.

12. A method of manufacturing the laser apparatus comprising the steps of forming a semiconductor laser element by separately forming a plurality of laser structures, each comprising a P-type clad layer, a N-type clad layer and at least one active layer interposed therebetween which are superposed on a substrate, each of the active regions being not smaller than 30 μm and not larger than 500 μm in width, forming a p+-semiconductor layer and an n'-semiconductor layer on the uppermost layer of predetermined one of the laser structures and bonding the side of the superposed layers of the predetermined laser structure to the lower surface of the substrate of one of the other laser structures, and providing a pair of heat sinks respectively on the upper and lower surfaces of the laser element.

* * * * *